(12) United States Patent
Kumagai

(10) Patent No.: US 7,892,059 B2
(45) Date of Patent: Feb. 22, 2011

(54) MANUFACTURING METHOD FOR ORGANIC ELECTROLUMINESCENT DISPLAY DEVICE INCLUDING ETCHING PARTITION WALL AFTER IMPARTING LYOPHILICITY TO PARTITION WALL AND PIXEL ELECTRODE

(75) Inventor: Minoru Kumagai, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 441 days.

(21) Appl. No.: 11/801,696

(22) Filed: May 10, 2007

(65) Prior Publication Data

US 2007/0264899 A1 Nov. 15, 2007

(30) Foreign Application Priority Data

May 10, 2006 (JP) ............... 2006-131002
Jun. 1, 2006 (JP) ............... 2006-152964

(51) Int. Cl.
*H01J 9/00* (2006.01)
*H01J 9/24* (2006.01)
*B05D 5/04* (2006.01)

(52) U.S. Cl. ......................... 445/24; 427/66
(58) Field of Classification Search ........................ None
See application file for complete search history.

(56) References Cited

U.S. PATENT DOCUMENTS

| | | | |
|---|---|---|---|
| 7,291,970 B2 | 11/2007 | Kuwabara | |
| 7,294,856 B2 | 11/2007 | Ito et al. | |
| 2003/0143339 A1 | 7/2003 | Kobayashi | |
| 2004/0119403 A1 | 6/2004 | McCormick et al. | |
| 2005/0079277 A1* | 4/2005 | Takashima et al. | 427/58 |
| 2005/0112341 A1* | 5/2005 | Ito et al. | 428/209 |
| 2006/0098521 A1 | 5/2006 | Shimoda et al. | |
| 2006/0220532 A1* | 10/2006 | Tanabe et al. | 313/503 |
| 2007/0019032 A1* | 1/2007 | Maekawa et al. | 347/45 |
| 2007/0057627 A1* | 3/2007 | Kidu et al. | 313/503 |
| 2008/0030119 A1 | 2/2008 | Ito et al. | |

FOREIGN PATENT DOCUMENTS

| | | |
|---|---|---|
| JP | 8-015504 A | 1/1996 |
| JP | 11-192450 A | 7/1999 |
| JP | 2001-076881 A | 3/2001 |
| JP | 2003-203766 A | 7/2003 |
| JP | 2003-224349 A | 8/2003 |
| JP | 2003-257656 A | 9/2003 |
| JP | 2003-347063 A | 12/2003 |

(Continued)

OTHER PUBLICATIONS

Korean Office Action (and English translation thereof) dated Apr. 17, 2008, issued in a counterpart Korean Application.

(Continued)

*Primary Examiner*—Toan Ton
*Assistant Examiner*—Britt D Hanley
(74) *Attorney, Agent, or Firm*—Holtz, Holtz, Goodman & Chick, PC

(57) ABSTRACT

A manufacturing method of a display device the method comprising a step of etching a surface of a partitioning wall formed on a substrate around region where a display pixel is formed.

10 Claims, 13 Drawing Sheets

FOREIGN PATENT DOCUMENTS

| | | |
|---|---|---|
| JP | 2004-106320 A | 4/2004 |
| JP | 2005-038634 A | 2/2005 |
| JP | 2005-116313 A | 4/2005 |
| JP | 2005-174906 A | 6/2005 |
| JP | 2005-251768 A | 9/2005 |
| JP | 2006-098977 A | 4/2006 |
| JP | 2006-119618 A | 5/2006 |
| JP | 2006-337935 A | 12/2006 |
| JP | 2007-111646 A | 5/2007 |
| KR | 2005-0053640 A | 6/2005 |
| WO | 2004/061992 A1 | 7/2004 |

OTHER PUBLICATIONS

Japanese Office Action (and English translation thereof) dated Apr. 28, 2008, issued in counterpart Japanese Patent Application No. 2006-131002.

Japanese Office Action (and English translation thereof) dated Apr. 28, 2008, issued in counterpart Japanese Patent Application No. 2006-152964.

Japanese Office Action dated Oct. 15, 2009 and English translation thereof issued in Japanese Application No. 2007-240627, which is a Japanese counterpart of *related* U.S. Appl. No. 12/211,230.

U.S. Appl. No. 11/523,400; First Named Inventor: Minoru Kumagai; Title: "Display Device and Method of Manufacturing the Same"; Filed: Sep. 19, 2006.

U.S. Appl. No. 12/211,230; First Named Inventor: Minoru Kumagai; Title: "Manufacturing Method of Display Apparatus"; Filed: Sep. 16, 2008.

Japanese Office Action dated Apr. 28, 2010 and English translation thereof in Japanese Application No. 2005-283958, which is a Japanese counterpart of related U.S. Appl. No. 11/523,400.

* cited by examiner

※ IN DRAWING, PARENTHESIZED NUMERALS INDICATE VERTICAL ORDERS OF LAYERS. LARGER NUMERALS INDICATE UPPER LAYERS.

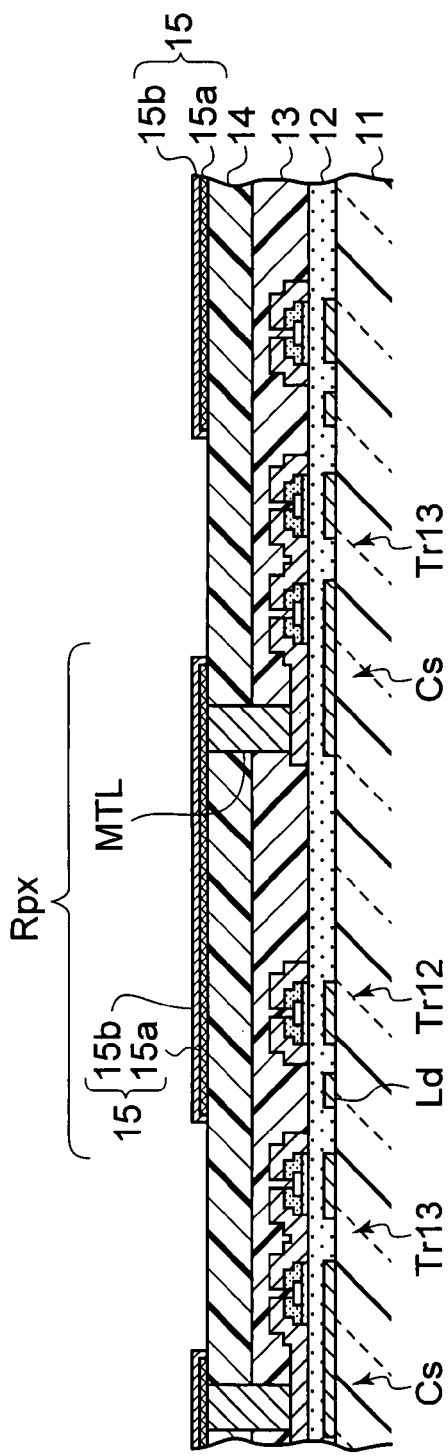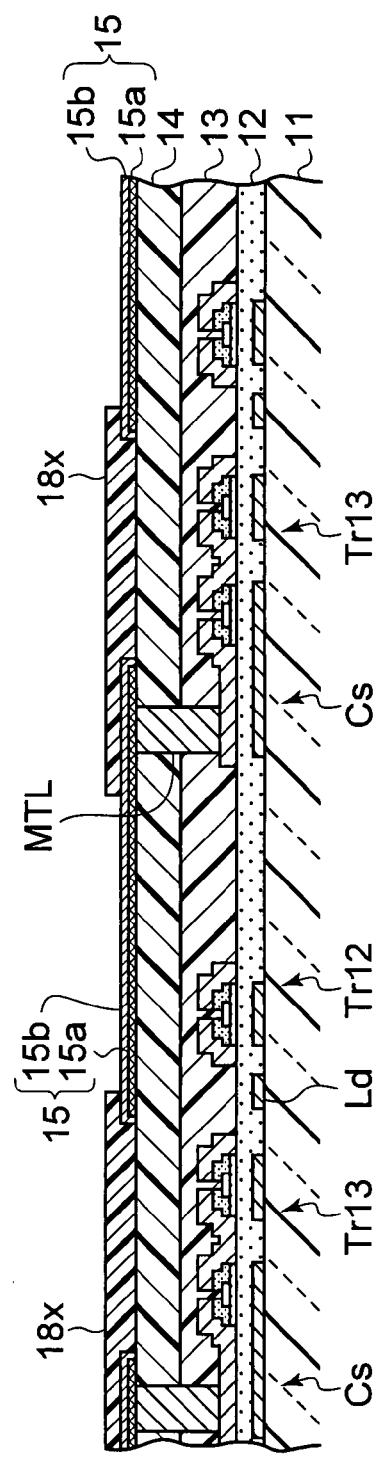
FIG. 8A
FIG. 8B

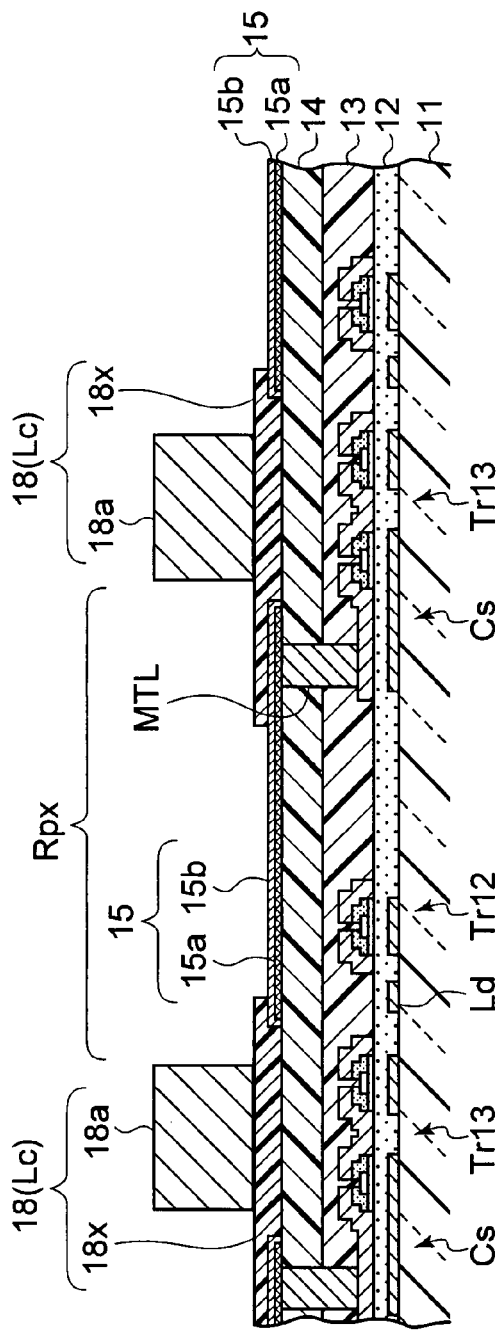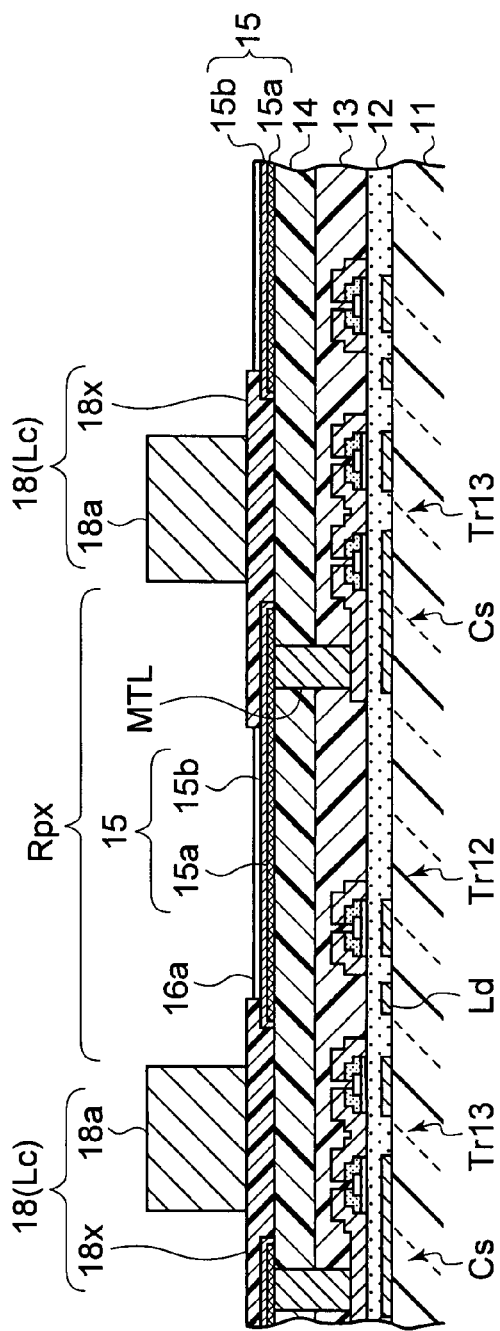

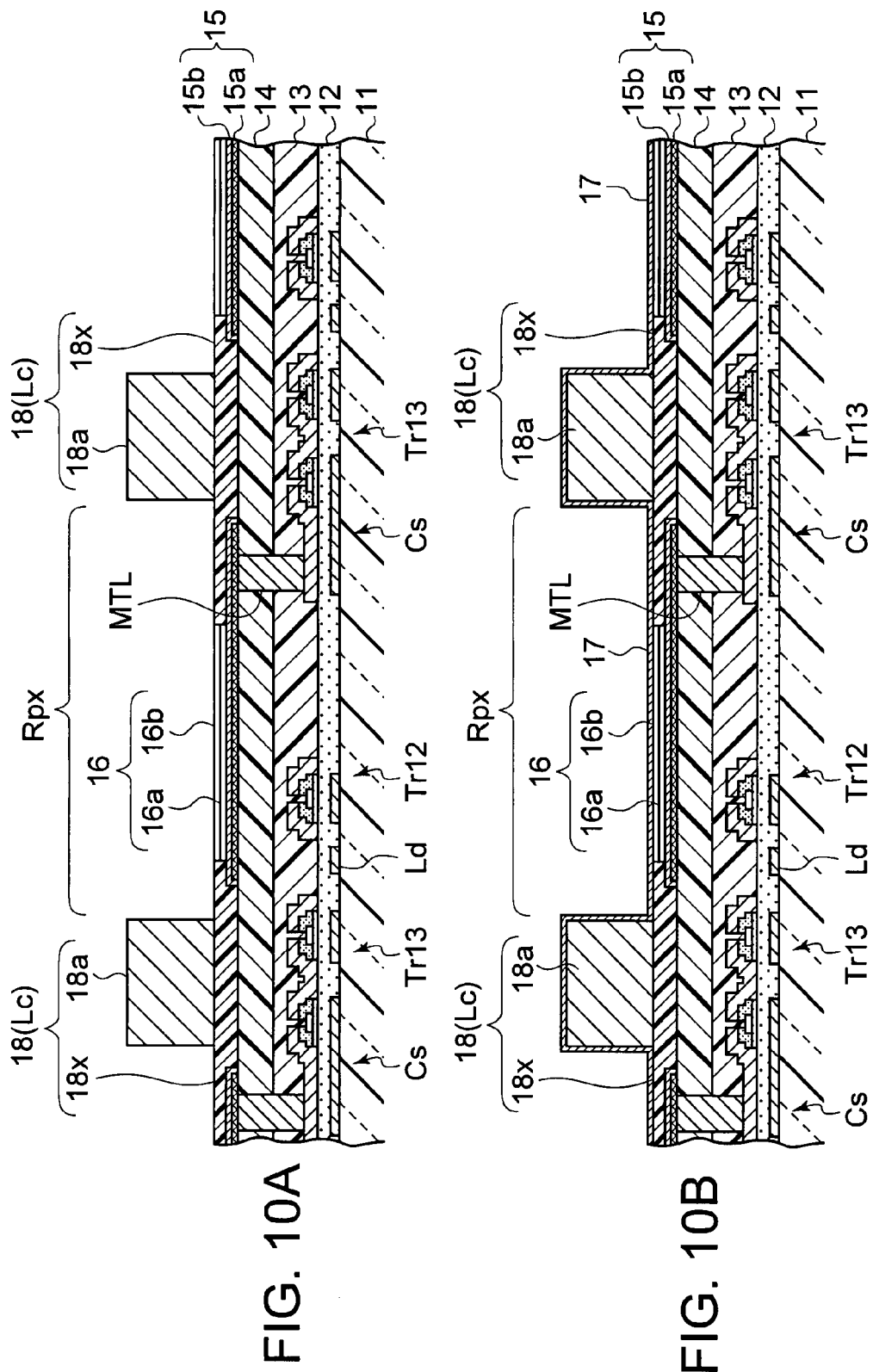

FLUORINE BASED TRIAZINEDITHIOL DERIVATIVE

| UV IRRADIATION TIME (min) | CONTACT ANGLE OF PURE WATER (°) |
|---|---|
| 2 | 12.1 |
| 4 | 7.8 |
| 6 | 6.3 |
| 8 | 5.3 |
| 10 | 5.3 |

| SOFT ETCHING TIME (sec) | CONTACT ANGLE OF PURE WATER (°) | |
|---|---|---|
| | Cu | ITO |
| 0 | 54.5 | 7.6 |
| 10 | 130.2 | 11.2 |
| 20 | 129.7 | 9.2 |
| 30 | 130.6 | 10.9 |

//  MANUFACTURING METHOD FOR ORGANIC ELECTROLUMINESCENT DISPLAY DEVICE INCLUDING ETCHING PARTITION WALL AFTER IMPARTING LYOPHILICITY TO PARTION WALL AND PIXEL ELECTRODE

BACKGROUND OF THE INVENTION

1. Field of the Invention

The present invention relates to a display device and a manufacturing method thereof, and particularly, to a display device having a display panel on which a plurality of display pixels each having a light emitting element whose carrier transporting layer is formed by coating a liquid material including a carrier transporting material, are arrayed in two dimensions, and a manufacturing method thereof.

2. Description of the Related Art

Recently, as a display device of an electronic apparatus such as a portable telephone, a portable music player, etc., there is known a display device on which mounted is a display panel (organic EL display panel), on which organic electroluminescence elements (hereinafter abbreviated as "organic EL elements") are arrayed in two dimensions. Particularly, an organic EL display panel adapted to an active matrix drive system has extremely superior characteristics to liquid crystal display devices widely spread, in that the display response speed is high, there is no dependency on view angles, high luminance, high contrast, and high preciseness of the display quality, etc. are available, and a compact and light body can be obtained because no backlight or light guide plate is needed unlike a liquid crystal display device.

As well known, an organic EL element roughly has an element structure formed of an anode (positive) electrode, an organic EL layer (light emitting function layer), and a cathode (negative) electrode which are sequentially stacked on one surface of a glass substrate or the like, and emits light (excitation light) based on the energy that is produced when holes and electrons injected into the organic EL layer are recombined in this layer, when a positive voltage is applied to the anode electrode and a negative voltage is applied to the cathode electrode in a manner that the organic EL layer exceeds a light emitting threshold. Organic EL elements are roughly classified into a low molecular type and a high molecular type, according to organic materials (positive hole transporting materials and electron-transporting light emitting materials) for forming a positive hole transporting layer (positive hole injecting layer) and an electron-transporting light emitting layer (light emitting layer), which make up the organic EL layer.

In a case where a low-molecular organic material is used, the manufacturing process of the organic EL element generally requires vapor deposition and therefore needs a mask in some case to prevent the low molecular material from being vapor-deposited on other areas than the anode electrode because it is necessary to selectively form a thin organic film of this low molecular type only on the anode electrode in a pixel forming region. Consequently, the low molecular material inevitably is deposited also on the surface of the mask, producing a great loss of material in the manufacturing process, making the manufacturing process inefficient.

On the other hand, in a case where a high-molecular organic material is used for the organic EL element, since an ink jetting method (liquid drop jetting method), a nozzle printing method (liquid flow jetting method), or the like can be used as a wet film forming method, the solution of the organic material can selectively be coated only on the anode electrode or a specific region including the anode electrode, providing a merit that a thin organic EL layer (a positive hole transporting layer and an electron-transporting light emitting layer) can be formed through an efficient manufacturing process with little material loss.

Further, some organic EL display panels of the high molecular type are known to have a panel structure with a continuous partitioning wall, which is formed to project upward from an insulating substrate such as a glass substrate or the like on which display pixels are arrayed and which is formed between pixel forming regions in which these display pixels are formed respectively, in order to define these pixel forming regions, and to prevent a phenomenon that light emitting colors, are mixed beyond the respective display pixels with light emitting materials of different colors from adjoining pixel forming regions mixing into other regions when liquid materials (solutions) made of high-molecular organic materials are coated. An organic EL display panel with such a partitioning wall is explained in, for example, Unexamined Japanese Patent Application KOKAI Publication No. 2001-76881.

SUMMARY OF THE INVENTION

An object of the present invention is to provide a display device having a display panel on which no color mixture is caused between adjoining display pixels and on which formed is a carrier transporting layer having a uniform film thickness approximately all over the region where each display pixel is formed, and a manufacturing method of the display device.

A manufacturing method of a display device according to the present invention is a manufacturing method of a display device, the method comprising:

a step of forming a partitioning wall which is arranged along a pixel forming region where a display pixel provided with a pixel electrode is formed;

a step of imparting lyophilicity to a surface of the pixel electrode;

a step of etching a surface of the partitioning wall; and a step of imparting liquid repellency to the surface of the partitioning wall.

BRIEF DESCRIPTION OF THE DRAWINGS

These objects and other objects and advantages of the present invention will become more apparent upon reading of the following detailed description and the accompanying drawings in which:

FIGS. 8A and 8B are cross-sectional diagrams of manufacturing steps (part 2) showing an example of a manufacturing method of the display device (display panel) according to the present embodiment;

FIGS. 9A and 9B are cross-sectional diagrams of manufacturing steps (part 3) showing an example of a manufacturing method of the display device (display panel) according to the present embodiment;

FIGS. 10A and 10B are cross-sectional diagrams of manufacturing steps (part 4) showing an example of a manufacturing method of the display device (display panel) according to the present embodiment;

DETAILED DESCRIPTION OF THE PREFERRED EMBODIMENT

A display device and a manufacturing method thereof according to the present invention will be explained below in detail, by showing an embodiment. In the embodiment described below, such a case will be explained, in which an organic EL element having an organic EL layer including a high-molecular organic material described above is used as the light emitting element to constitute each pixel.

(Display Panel)

First, a display panel (organic EL panel) and pixels to be used in the display device according to the present invention will be explained.

Figure 1:
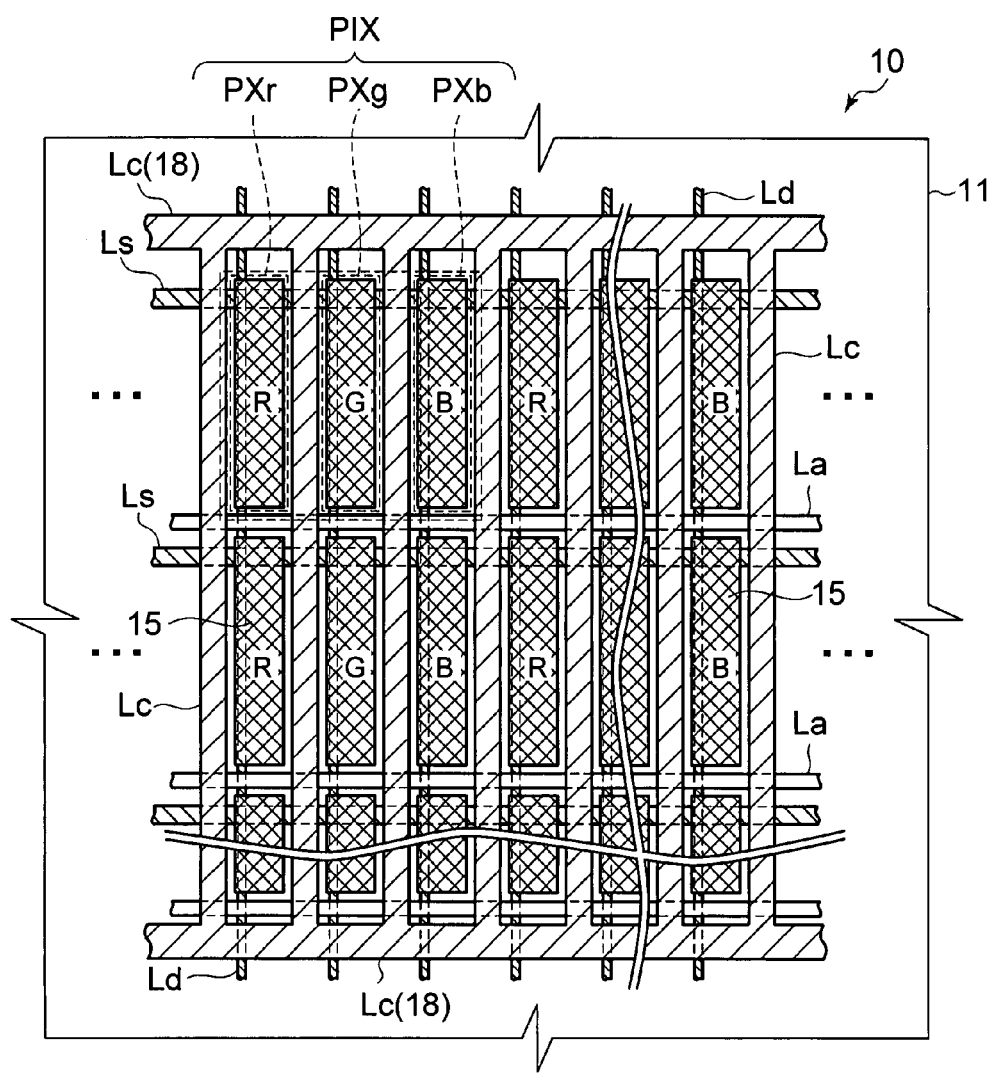
FIG. 1 is a schematic plan view showing one example of pixel array on a display panel used on a display device according to the present invention.
Figure 2:
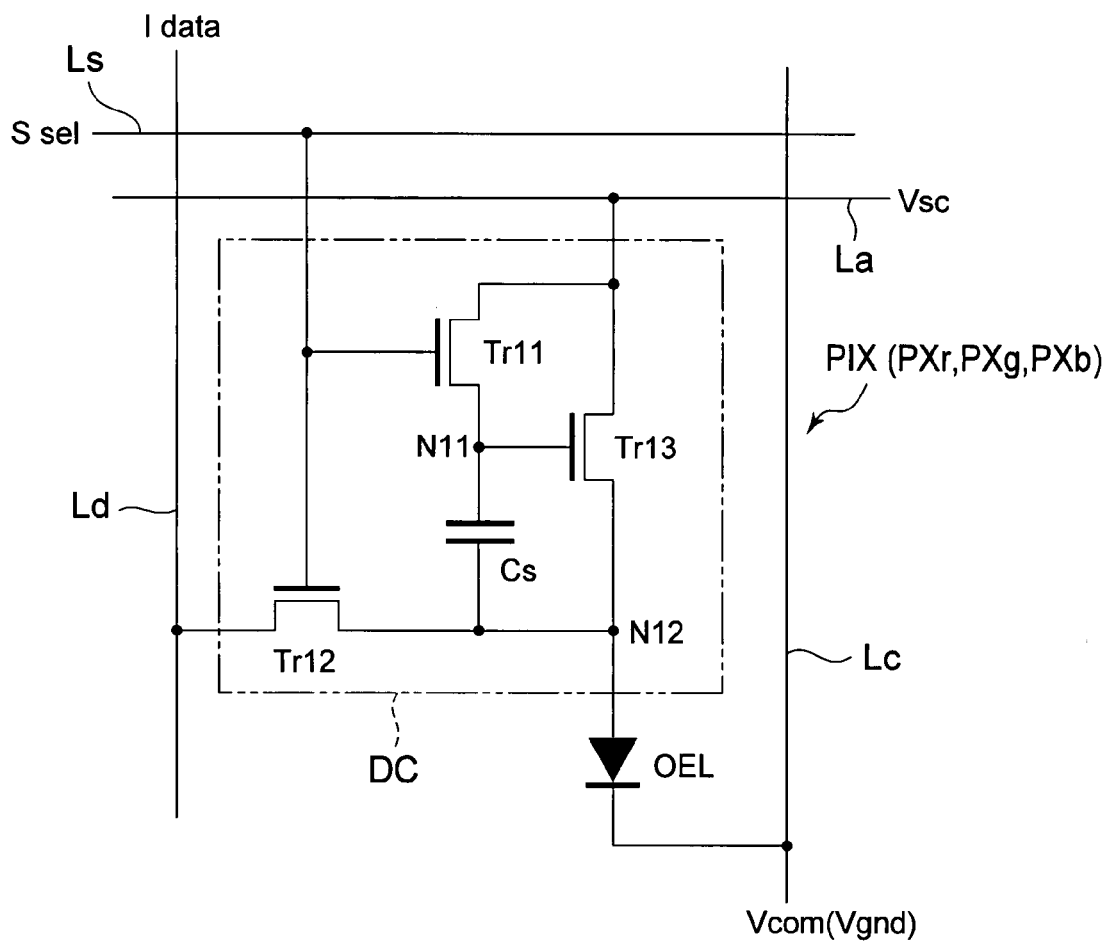
FIG. 2 is an equivalent circuit schematic showing an example of the circuit structure of each display pixel (display element and pixel drive circuit) two-dimensionally arrayed on the display panel of the display device according to the present invention.

FIG. 1 is a schematic plan view showing an example of an array of pixels on the display panel used on the display device according to the present invention. FIG. 2 is an equivalent circuit schematic showing an example of a circuit structure of each pixel (a display element and a pixel drive circuit) to be two-dimensionally arrayed on the display panel of the display device according to the present invention. To facilitate understanding, the plan view of FIG. 1 only shows the relationship between the arrangement of pixel electrodes provided in the respective pixels (color pixels) and the allocation of wiring layers, as seen from the viewing side of the display panel (or an insulating substrate), and does not show transistors, etc. in the pixel drive circuit of FIG. 2 provided for each pixel for driving an organic EL element (display element) of each pixel to emit light. Further, FIG. 1 uses hatching for the sake of clarifying the arrangement of the pixel electrodes and wiring layers.

As shown in FIG. 1, the display device (display panel) according to the present invention has a plural number (a multiple of 3) of color pixels PXr, PXg, and PXb having three colors of red (R), green (G), and blue (B) arrayed on one surface of an insulating substrate 11 such as a glass substrate or the like repeatedly in the left and right direction of the drawing, while having a plural number of color pixels PXr, PXg, and PXb arrayed in the up and down direction of the drawing on the basis of a single color in each column. Here, adjoining color pixels PXr, PXg, and PXb having three colors of R, G, and B respectively form a group and constitute one display pixel PIX.

The display panel 10 has a common voltage line (for example, a cathode line) Lc, which is shaped like a bank (partitioning wall) having a fence-like or lattice-like plan-view pattern, projecting from one surface of the insulating substrate 11 to define color pixel regions each including a plurality of color pixels PXr, or color pixels PXg, or color pixels PXb of a single color arrayed in the up and down direction. The respective pixel forming regions, in which the plurality of color pixels PXr, or color pixels PXg, or color pixels PXb included in each color pixel region are formed respectively, are each provided with a pixel electrode (for example, an anode electrode) 15, and each have a data line Ld laid in the up and down direction (i.e., column direction) in parallel with the direction in which the common voltage line Lc is laid, and a selection line Ls and a supply voltage line (for example, an anode line) La laid in the left and right direction (i.e., row direction) orthogonally to the data line Ld.

A specific circuit structure of each color pixel PXr, PXg, and PXb of each display pixel PIX is constituted by, as shown in, for example, FIG. 2, a pixel drive circuit (pixel circuit) DC formed on the insulating substrate 11 and comprising at least one transistor (e.g., an amorphous silicon thin film transistor or the like), and an organic EL element (display element) OEL which functions to emit light when a light emission drive current generated by the pixel drive circuit DC is supplied to the pixel electrode 15.

The supply voltage line La is connected directly or indirectly to, for example, a predetermined high-potential power source, and applies a predetermined high voltage (supply voltage Vsc) to the pixel electrodes 15 (e.g., anode electrodes) of the organic EL elements OEL provided in each display pixel PIX (color pixels PXr, PXg, and PXb) in order for a light emission drive current corresponding to display data (gradation current Idata) to flow in the pixel electrodes 15. The common voltage line Lc is connected directly or indirectly to, for example, an opposing electrode (e.g., a cathode electrode) of the organic EL elements OEL, and applies a predetermined low voltage (common voltage Vcom; e.g., a ground voltage Vgnd).

The pixel drive circuit DC comprises a transistor Tr11, a transistor Tr12, and a transistor Tr13 (switching elements for light emission drive purpose), and a capacitor Cs, as shown in, for example, FIG. 2. The transistor Tr11 has its gate terminal connected to the selection line Ls which is laid in the row direction of the display panel 10 (insulating substrate 11), has its drain terminal connected to the supply voltage line La, and has its source terminal connected to a node N11. The transistor Tr12 has its gate terminal connected to the selection line Ls, has its source terminal connected to the data line Ld which is laid in the column direction of the display panel 10, and has its drain terminal connected to a node N12. The transistor Tr13 has its gate terminal connected to the node N11, has its drain terminal connected to the supply voltage line La, and has its source terminal connected to the node N12. The capacitor Cs is connected to the transistor Tr13 and between the node N11 and the node N12 (between the gate and source of the transistor Tr13). Here, the transistors Tr11 to Tr13 are all n channel type thin film transistors. The thin film transistors may be amorphous silicon thin film transistors or may be polysilicon thin film transistors.

The organic EL element OEL has its anode terminal (pixel electrode 15 to serve as an anode electrode) connected to the node N12 of the pixel drive circuit DC, and has its cathode terminal (opposing electrode to serve as a cathode electrode) connected to the common voltage line Lc laid in the column direction of the display panel 10. Further, in FIG. 2, the capacitor Cs is a parasitic capacitor produced between the gate and source of the transistor Tr13, or an auxiliary capacitor additionally formed between the gate and source of the transistor Tr13.

In the pixel drive circuit DC shown in FIG. 2, the selection line Ls is connected to an unillustrated selection driver, and a selection signal Ssel for setting a plurality of pixels (color pixels PXr, PXg, and PXb) arrayed in the row direction of the display panel 10 to a selected state is applied by the selection driver to the pixels at a predetermined timing. The supply voltage line La is connected to an unillustrated power source driver, and a predetermined supply voltage Vsc is applied by the power source driver to pixels arrayed in the same row at a timing synchronous with the selection signal Ssel. The data line Ld is connected to an unillustrated data driver, and a gradation current Idata corresponding to display data flows at a timing synchronous with the selected state of the pixels.

The drive control on the pixels (display panel 10) comprising the pixel driver circuit DC having such a circuit structure starts with application of a selection signal Ssel of a selection level (an "on" level; for example, a high level) to the selection line Ls from the unillustrated selection driver in a writing operation period, and synchronously with the selection signal Ssel, application of a supply voltage Vsc of a low level to the supply voltage line (anode line) La from the unillustrated power source driver.

In synchronization with this timing, the unillustrated data driver performs control such that a gradation current Idata having a current value corresponding to display data flows through the data line Ld. That is, the data driver is a driver that controls the current value of the gradation current Idata corresponding to display data, and according to the present embodiment, lets the gradation current Idata having a desired current value flow like withdrawing it from the pixel (pixel drive circuit DC) toward the data line Ld by setting the potential of the data line Ld lower than the supply voltage Vsc, which is a voltage fixed at a low level during the writing operation period.

Consequently, the transistors Tr11 and Tr12 of the pixel drive circuit DC are turned on to apply the supply voltage Vsc of low level to the node N11 (the gate terminal of the transistor Tr13; one end of the capacitor Cs) and at the same time apply a voltage level of a lower potential than the supply voltage Vsc of low level to the node N12 (the source terminal of the transistor Tr13; the other end of the capacitor Cs) through the transistor Tr12 due to the withdrawing of the gradation current Idata, forcing the gradation current Idata set by the data driver to flow through the transistor Tr13.

At this time, charges corresponding to the potential difference produced across the node N11 and the node N12 are accumulated in the capacitor Cs, and retained (charged) as a voltage component. The amount of charges accumulated is automatically set by the current value of the gradation current Idata that flows across the drain and source of the transistor Tr13 during the wiring operation period. Further, at this time, since the supply voltage Vsc of low level is set equal to or lower than a common potential Vcom (ground potential Vgnd) which is applied to the cathode terminal through the common voltage line (cathode line) Lc, no forward biasing voltage is applied to the organic EL element OEL. Therefore, the organic EL element OEL has no light emission drive current flow therethrough during the writing operation period, and does not therefore emit light.

Next, in a light emitting operation period, the selection driver applies a selection signal Ssel of a non-selection level (an "off" level; for example, a low level) to the selection line Ls, and the power source driver applies a supply voltage Vsc of high level to the supply voltage line La. Further, in synchronization with this timing, the data driver stops withdrawing the gradation current Idata.

As a result, the transistors Tr11 and Tr12 are turned off to cut the application of the supply voltage Vsc to the node N11 together with cutting the application of the voltage level attributed to the withdrawing of the gradation current Idata to the node N12, and the capacitor Cs therefore retains the charges accumulated therein during the wiring operation described above.

Like this, by the capacitor Cs retaining the charges (charged voltage) accumulated during the writing operation, the potential difference between the node N11 and the node N12 (between the gate and source of the transistor Tr13) is retained, and the transistor Tr13 is thus kept able to let a current having a current value corresponding to the current value of the gradation current Idata flow. Further, when a supply voltage Vsc, which is of a higher voltage level than the common voltage Vcom (ground voltage Vgnd) and which has such a predetermined voltage value as would increase the potential difference between the drain and source of the transistor Tr13 to grow a current flowing through the transistor Tr13 during a light emitting operation period to a saturated current, is applied to the supply voltage line La, the transistor Tr13 lets a light emission drive current corresponding to the current value of the gradation current Idata that has flowed during the writing operation period flow through the organic EL element OEL in the forward biasing direction, making the organic EL element OEL emit light at the luminance corresponding to the gradation current Idata, or more originally, to the display data.

By repeating this series of drive control operations for all the pixels (color pixels PXr, PXg, and PXb) two-dimensionally arrayed on the display panel 10 in the unit of, for example, each row, it is possible to perform an image display operation of displaying desired image information.

(Device Structure of Pixel)

Next, a specific device structure (plan layout and cross-sectional structure) of the pixel (light emission drive circuit and organic EL element) having the circuit structure described above will be explained.

Figure 3:
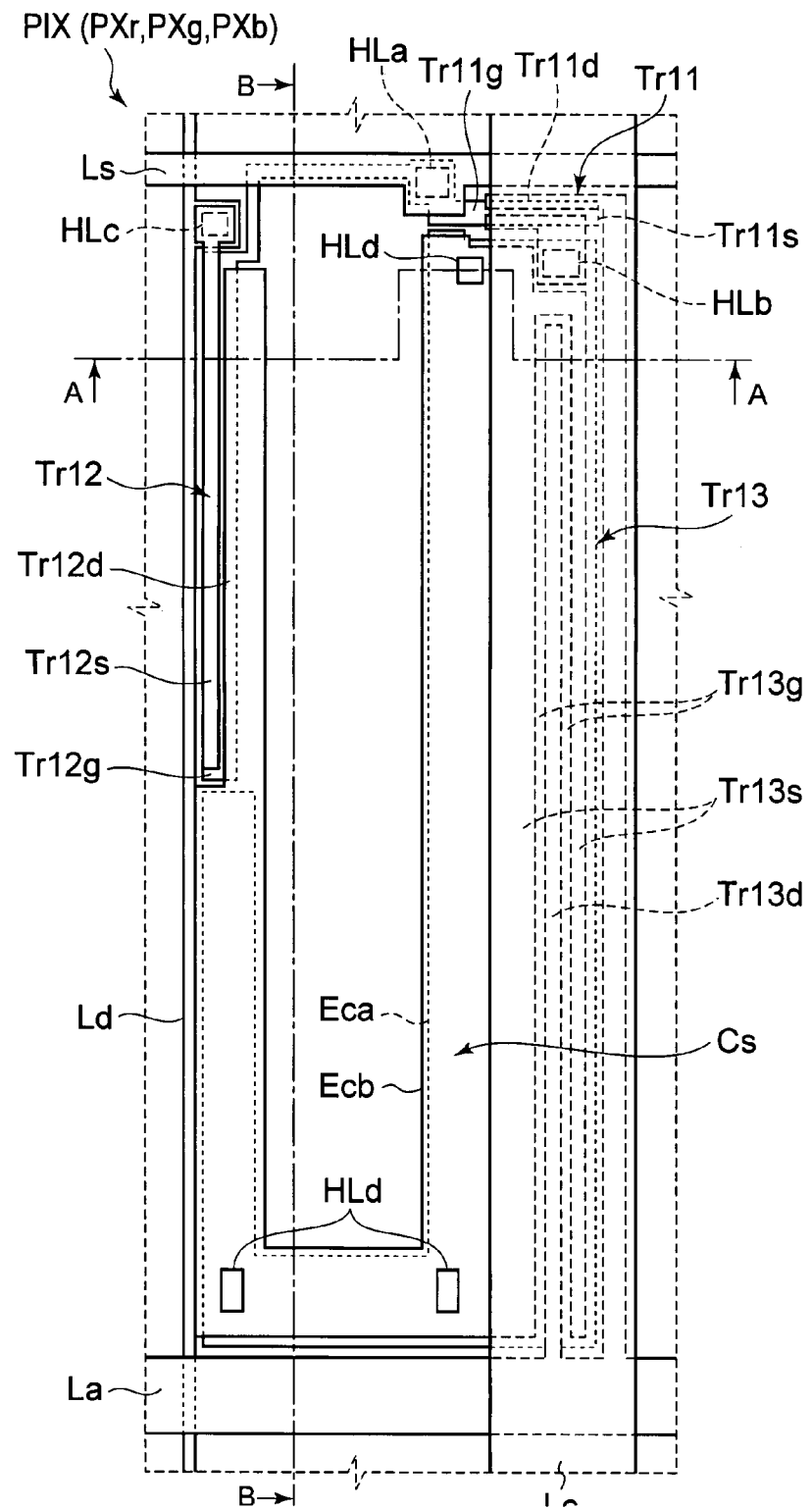
FIG. 3 is a plan layout showing one example of a display pixel applicable to the display device (display panel) according to an embodiment of the present invention.
Figure 4:
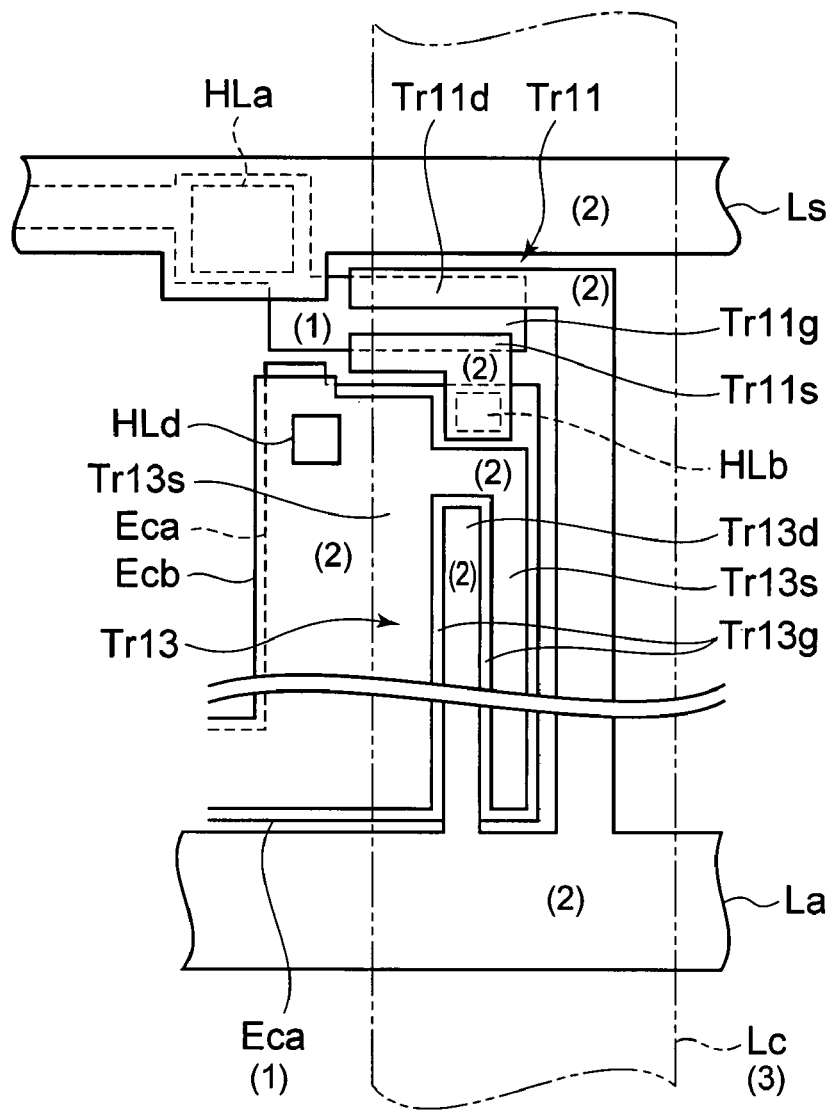
FIG. 4 is a diagram detailing the principal part of the plan layout of the display pixel according to the present embodiment.
Figure 5:
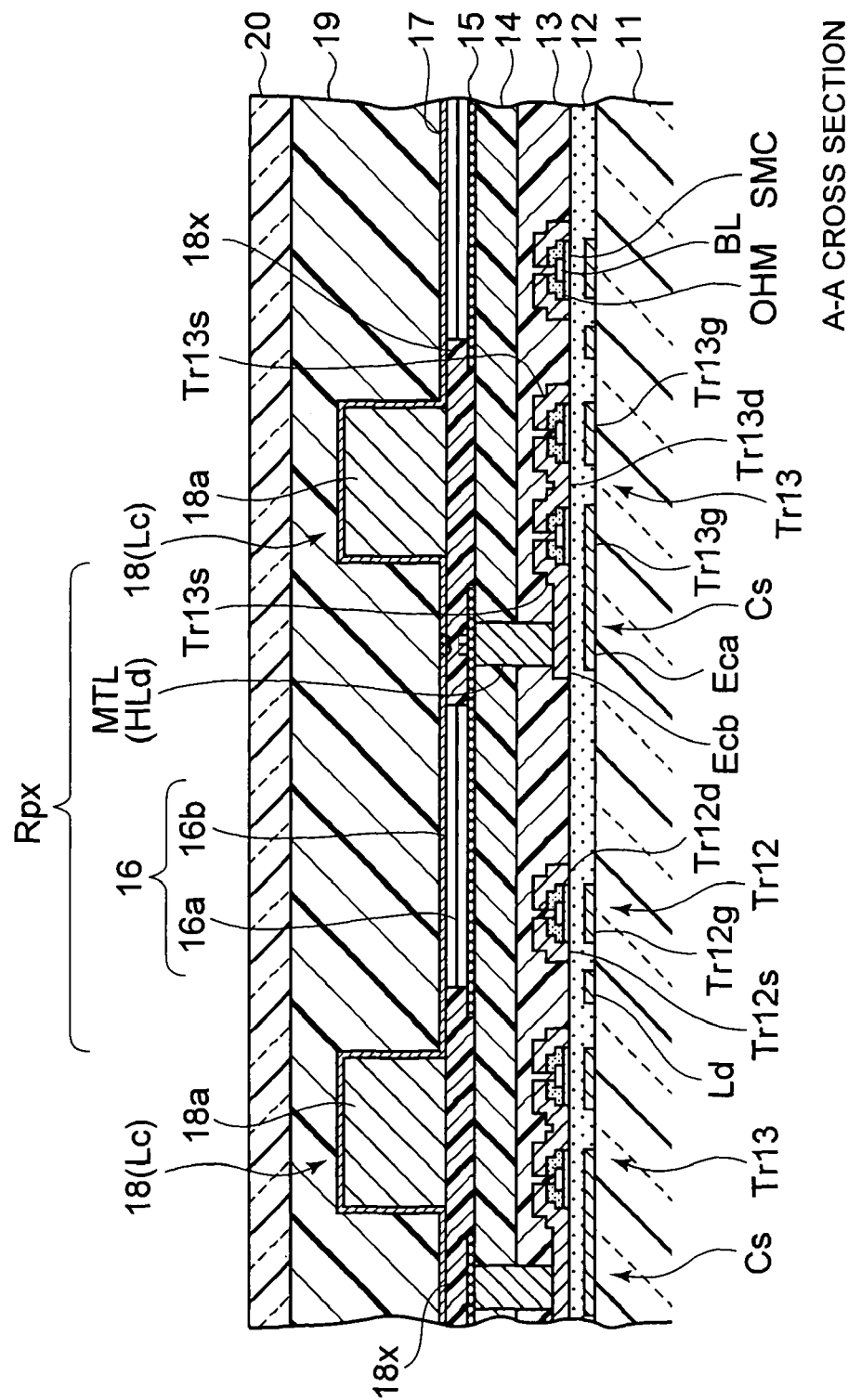
FIG. 5 is a schematic cross-sectional diagram showing a cross section along a line A-A of the display pixel having the plan layout according to the present embodiment.
Figure 6:
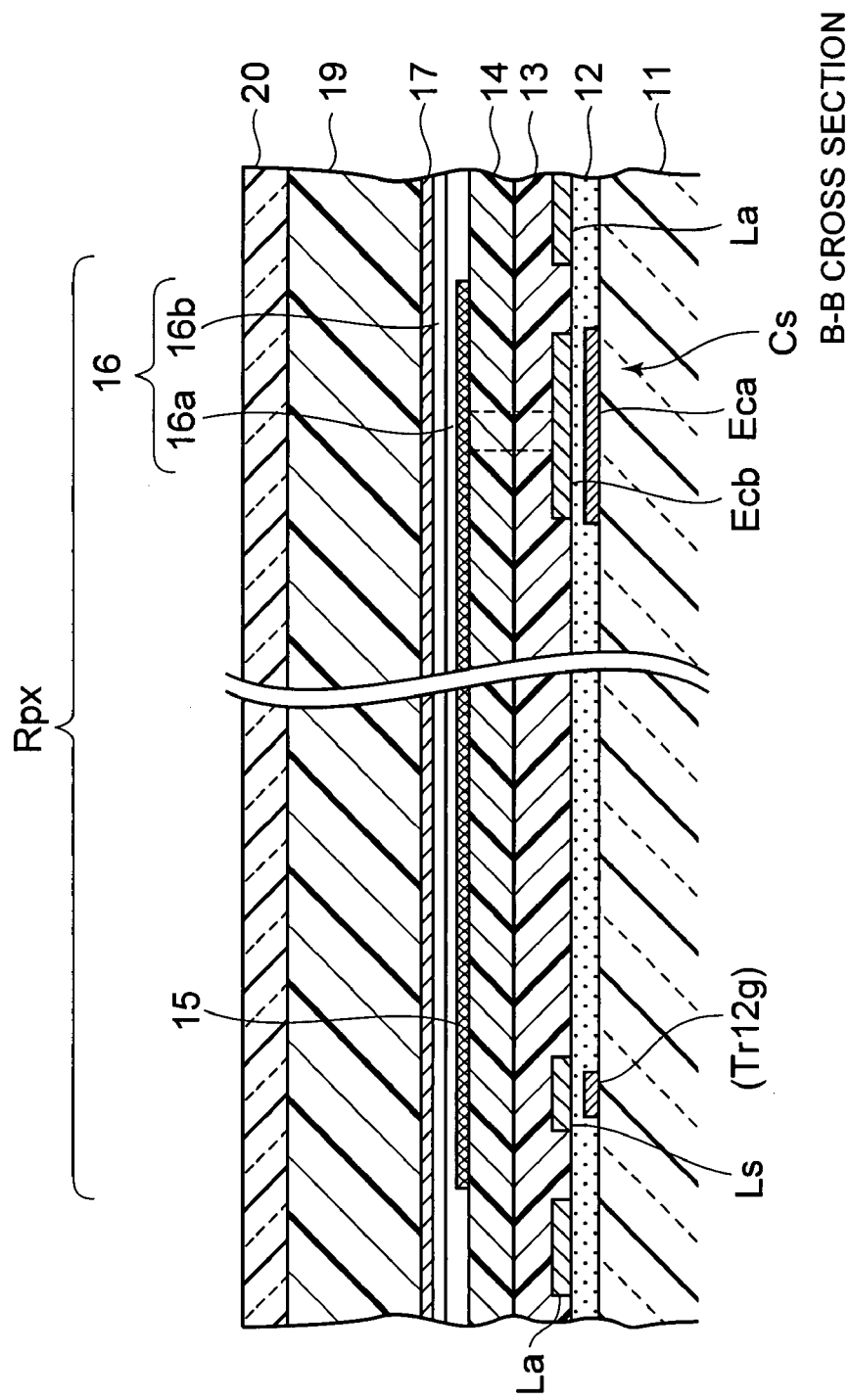
FIG. 6 is a schematic cross-sectional diagram showing a cross section along a line B-B of the display pixel having the plan layout according to the present embodiment.

FIG. 3 is a plan layout diagram showing an example of a pixel applicable to the display device (display panel) according to the present embodiment. FIG. 4 is a diagram detailing the principal part of the plan layout of the pixel according to the present embodiment. Here, a plan layout of one specific color pixel among the color pixels PXr, PXg, and PXb of red (R), green (G), and blue (B) of the display pixel PIX shown in FIG. 1 is shown. FIG. 3 mainly shows a layer on which the transistors of the pixel drive circuit DC, wiring layers, etc. are formed. FIG. 4 specifically shows a view of transistors, wiring layers, etc. that are formed on a lower layer than the common voltage line Lc, as cut out from the plan layout of FIG. 3. Parenthesized numerals of FIG. 4 indicate the vertical order of each conductive layer (including wiring layers), where the smaller the numeral is, the lower (the closer to the insulating substrate 11) the layer is, while the larger the numeral is, the upper (the closer to the viewing side) the layer is. In other words, in FIG. 4, the layer denoted as (1) is formed lower than the layer denoted as (2), and the layer denoted as (2) is formed lower than the layer denoted as (3). FIG. 5 and FIG. 6 are schematic cross-sectional diagrams of the display pixel PIX having the plan layout of FIG. 3, as sectioned along A-A and B-B respectively.

Specifically, the display pixel PIX (color pixels PXr, PXg, and PXb) shown in FIG. 2 includes pixel forming regions (regions where color pixels PXr, PXg, and PXb are formed respectively) Rpx defined on one surface of the insulating substrate 11, each of which pixel forming regions has a selection line Ls and a supply voltage line La laid so as to extend in the row direction (left and right direction of the drawing) in its upper and lower edge regions in the plan layout of FIG. 3, and has a data line Ld and a common voltage line Lc laid so as to extend in the column direction (up and down direction of the drawing) in its left an right edge regions in the plan layout of FIG. 3 so as to orthogonally cross the lines Ls and La.

Here, as shown in FIG. 3 to FIG. 6, the supply voltage line La is formed lower (closer to the insulating substrate 11) than the common voltage line Lc, the selection line Ls and the supply voltage line La are formed level, and the data line Ld is formed lower than the selection line Ls and the supply voltage line La. The selection line Ls is formed in the same manufacturing step as forming the source and drain of the transistors Tr11 to Tr13, by patterning a source/drain metal layer for forming the source and drain. The data line Ld is formed in the same manufacturing step as forming the gate of the transistors Tr11 to Tr13, by patterning a gate metal layer for forming the gate.

That is, the display pixel PIX has the plurality of transistors Tr11 to Tr13 and capacitor Cs of the pixel drive circuit DC (see FIG. 2), which is formed in the display pixel PIX, and the various wiring layers including the selection line Ls and the data line Ld, all formed on the insulating substrate 11, as shown in FIG. 5 and FIG. 6. A protective insulating film 13 and a flattening film 14 are formed sequentially so as to cover the transistors Tr11 to Tr13 and the wiring layers. An organic EL element OEL, which includes: a pixel electrode (e.g., an anode electrode) 15 connected to the pixel drive circuit DC to be supplied with a predetermined light emission drive current; an organic EL layer (light emitting function layer) 16 including a positive hole transporting layer 16a (carrier transporting layer) and an electron-transporting light emitting layer 16b (carrier transporting layer); and an opposing electrode (e.g., a cathode electrode) 17 to which a common voltage Vcom is applied, is formed on an upper layer than the protective insulating film 13 and the flattening film 14.

In the pixel drive circuit DC, as more specifically shown in FIG. 3 and FIG. 4, the transistor Tr11 shown in FIG. 2 is disposed so as to extend along the selection line Ls laid in the row direction, the transistor Tr12 is disposed so as to extend along the data line Ld laid in the column direction, and the transistor Tr13 is disposed so as to extend along the common voltage line Lc laid in the column direction.

Each of the transistors Tr11 to Tr13 has the structure of a well-known field effect transistor, and comprises a gate electrode Tr11g, Tr12g, or Tr13g formed on the insulating substrate 11, a semiconductor layer SMC formed correspondingly to the gate electrode Tr11g, Tr12g, or Tr13g, and a source electrode Tr11s, Tr12s, or Tr13s and a drain electrode Tr11d, Tr12d, or Tr13d which are formed to extend from both ends of the semiconductor layer SMC.

A block layer BL made of silicon oxide, silicon nitride, or the like, which is for preventing any etching damage on the semiconductor layer SMC is formed on the semiconductor layer SMC, above which the source electrode and drain electrode of the transistors Tr11 to Tr13 face each other, and an impurity layer OHM for realizing ohmic connection between the semiconductor layer SMC and the source electrode or the drain electrode is formed on the semiconductor layer SMC at where the semiconductor layer SMC is contacted by the source electrode or the drain electrode. The gate electrodes Tr11g to Tr13g of the transistors Tr11 to Tr13 are all formed by patterning the same gate metal layer. The source electrodes Tr11s to Tr13s and drain electrodes Tr11d to Tr13d of the transistors Tr11 to Tr13 are all formed by patterning the same source/drain metal layer.

As shown in FIG. 3 and FIG. 4, the transistor Tr11 has its gate electrode Tr11g connected to the selection line Ls through a contact hole HLa opened in a gate insulating film 12, has its source electrode Tr11s connected to an electrode Eca of the capacitor Cs at one end thereof (closer to the node N11) through a contact hole HLb opened in the gate insulating film 12, and has its drain electrode Tr11d formed integrally with the supply voltage line La, so as to correspond to the circuit structure of the pixel drive circuit DC shown in FIG. 2.

As shown in FIG. 3 to FIG. 5, the transistor Tr12 has its gate electrode Tr12g connected to the selection line Ls through the contact hole HLa opened in the gate insulating film 12, has its source electrode Tr12s connected to the data line Ld through a contact hole HLc opened in the gate insulating film 12, and has its drain electrode T12d integrally formed with an electrode Ecb of the capacitor Cs at the other end thereof (closer to the node N12).

As shown in FIG. 3 to FIG. 5, the transistor Tr13 has its gate electrode Tr13g formed integrally with the electrode Eca of the capacitor Cs at the one end thereof (closer to the node N11), has its source electrode Tr13s integrally formed with the electrode Ecb of the capacitor Cs at the other end thereof (closer to the node N12), and has its drain electrode Tr13d integrally formed with the supply voltage line Lz.

The capacitor Cs is formed such that its electrode Eca at the one end that is formed integrally with the gate electrode Tr13g of the transistor tr13 and its electrode Ecb at the other end that is formed integrally with the source electrode Tr13s spread while facing each other with the gate insulating film 12 interposed therebetween.

As shown in FIG. 3, FIG. 4, and FIG. 6, the selection line Ls extends on the gate insulating film 12, and is formed on the same layer as the supply voltage line (anode line) La.

As shown in FIG. 5, a contact hole HLd is formed in the protective insulating film 13 and flattening film 14 above the source electrode Tr13s of the transistor Tr13 (above the electrode Ecb of the capacitor Cs), and a metal material (contact metal MTL) is filled in the contact hole HLd so that the source electrode Tr13s and the pixel electrode 15 of the organic EL element OEL are electrically connected to each other.

And as shown in FIG. 5 and FIG. 6, an organic EL element is formed on the flattening film 14 of each pixel forming region Rpx, by sequentially stacking a pixel electrode 15 to serve as, for example, an anode electrode, an organic EL layer 16 comprising a positive hole transporting layer 16a and an electron-transporting light emitting layer 16b, and an opposing electrode 17 to serve as, for example, a cathode electrode. In the present embodiment, described is a display panel (organic EL panel) having a top-emission type light emitting structure for outputting light emitted from the organic EL layer 16 toward the opposite side to the insulating substrate 11 (through a sealing resin layer 19 and a sealing substrate 20, which are to be described later). Therefore, the pixel electrode 15 should have at least light reflectivity and the opposing electrode 17 should have light transmissivity. The pixel electrode 15 has a stacked structure of a reflective metal layer 15a on the lower level and a transparent conductive metal oxide layer 15b on the upper level, as will be explained in a manufacturing method (see FIG. 7 to FIG. 10) described later.

A bank (partitioning wall) 18 for defining the regions where the organic EL elements OEL are formed (to be more precise, the regions where the organic EL layers 16 are formed) is formed along the column direction so as to project from the upper surface of the flattening film 14 between the pixel forming regions Rpx arranged (in the boundary region between the regions where the organic EL elements OEL of the respective color pixels PXr, PXg, PXb are formed). In the present embodiment, as shown in, for example, FIG. 5, the bank 18 extends in the column direction, and comprises a base layer 18x and a bank metal layer 18a which are stacked. The base layer 18x formed on the lower level functions as an interlayer insulating film between the pixel forming regions Rpx. The bank metal layer 18a on the upper level is made of a conductive material and extends in the column direction in parallel with the common voltage line (cathode line) Lc.

To be more specific, the base layer 18x is formed on the flattening film 14 near the boundary between adjoining color pixels PXr, PXg, and PXb in the row direction, and has its parts formed so as to be overlaid on the column-direction edges of the pixel electrodes 15 of the organic EL elements OEL. The base layer 18x is made of silicon nitride film (SiN) or the like and provided to extend in the column direction. The bank metal layer 18a is formed on the base layer 18x and made of a conductive material (e.g., a metal material). The base layer 18x and the bank metal layer 18a are sequentially stacked so as to project in the thickness-wise direction and to extend in the column direction. The ends of a plurality of the base layer 18x and bank metal layer 18a parallel in the column direction are joined to one another outside the pixel forming regions of the plurality of pixels, so as to form row-direction lines.

That is, with the bank 18, which has the above-described stacked structure, placed over the display panel 10 (insulating substrate 11) to have a fence-like plan-view pattern, a plurality of pixel forming regions (the regions where the organic EL layers 16 of the organic EL elements OEL are formed) of the plurality of color pixels PXr, PXg, and PXb arrayed in the row direction (left and right direction of the drawing) are defined, and the bank metal layer 18a of the bank 18 can function as the wiring layer (common voltage line Lc) which can apply a predetermined voltage (common voltage Vcom) commonly to the respective color pixels PXr, PXg, and PXb (organic EL elements OEL) arrayed all over the display panel 10.

That is, by forming the opposing electrode (cathode electrode) 17 of the organic EL element OEL so as to spread over the bank 18 having the bank metal layer 18a and so as to have electrical connection with the bank metal layer 18a as shown in FIG. 5 and FIG. 6, it is possible to make the bank 18 (bank metal layer 18a) function also as the common voltage line Lc.

A sealing substrate 20 formed of a glass substrate or the like is joined over the insulating substrate 11 on which the pixel drive circuit DC, the organic EL element OEL, and the bank 18 are formed, such that the sealing substrate 20 faces the insulating substrate 11 with a transparent sealing resin layer 19 interposed therebetween.

In this display panel 10, which has the pixel drive circuit DC including the function elements such as the transistors Tr11 to Tr13, the capacitor Cs, etc., and the wiring layers such as the selection line Ls, the data line Ld, the supply voltage line (anode line) La, etc., which are all formed on the lower-level layers (which are under a layer of the organic EL element OEL that is closest to the insulating substrate 11) of the display panel 10, a light emission drive current having a predetermined current value flows across the drain and source of the transistor Tr13 based on a gradation current Idata corresponding to display data supplied through the data line Ld, and is supplied to the pixel electrode 15 of the organic EL element OEL from the transistor Tr13 (source electrode Tr13s) through the contact hole HLd (contact metal MTL), thereby making the organic EL element OEL of the respective display pixels PIX (color pixels PXr, PXg, and PXb) emit light at a desired luminance gradation corresponding to the display data.

At this time, in a case where the display panel 10 shown in the present embodiment has light reflectivity in the pixel electrode 15 and light transmissivity in the opposing electrode 17 (that is, in a case where the organic EL element OEL is a top emission type), light emitted from the organic EL layer 16 of each display pixel PIX (color pixels PXr, PXg, PXb) is let out toward one surface side of the sealing substrate 20 (upward in FIG. 5 and FIG. 6) without passing through the insulating substrate 11 (display panel 10), directly through the opposing electrode 17 having light transmissivity or as reflected by the pixel electrode 15 having light reflectivity.

A display element (organic EL element) having the top-emission type light emitting structure has been explained in the present embodiment. However, the present invention is not limited to this. For example, with the use of a pixel electrode 15 having light transmissivity and an opposing electrode 17 having light reflectivity, the present invention can be applied to a display element having a bottom-emission type light emitting structure which lets out light emitted from the organic EL layer 16 toward the other side (downward in FIG. 5 and FIG. 6) directly through the pixel electrode 15 having light transmissivity or by reflecting the light on the opposing electrode 17 having light reflectivity.

(Manufacturing Method of Display Device)

Next, a manufacturing method of the display device (display panel) described above will be explained.

FIGS. 7 to FIGS. 10 are cross sectional views observed in the manufacturing steps, which show one example of the manufacturing method of the display device (display panel) according to the present embodiment. Here, the manufacturing process of the panel structure seen from the cross-sectional plane along the line A-A shown in FIG. 5 will be explained. FIGS. 11 show the chemical constitution formula of a coating material on the surface of the bank 18 formed on the display device (display panel 10) according to the present embodiment, and a conceptual diagram showing the bond of the coating material when it is coated over the bank metal layer 18a.

The manufacturing method of the display device (display panel 10) described above starts from, as shown in FIG. 7A, forming the transistors Tr11 to Tr13, the capacitor Cs, and the wiring layers such as the data line Ld, the selection line Ls, etc. which are included in the above-described pixel drive circuit DC (see FIG. 2 to FIG. 4), in the regions (pixel forming regions) Rpx where the display pixels PIX (color pixels PXr, PXg, and PXb) are to be formed, which regions are defined on one surface (upper surface in the drawing) of the insulating substrate 11 formed of a glass substrate or the like (see FIG. 5 and FIG. 6).

Specifically, the gate electrodes Tr11g to Tr13g, the electrode Eca of the capacitor Cs at its one end, which is formed integrally with the gate electrode Tr13g, and the data line Ld (see FIG. 5) are formed simultaneously by patterning the same gate metal layer, and after this, the gate insulating film 12 is formed to cover the insulating substrate 11 entirely.

Next, the semiconductor layer SMC made of, for example, amorphous silicon, polysilicon, or the like is formed on the gate insulating film 12 so as to positionally correspond to the gate electrodes Tr11g to Tr13g. Next, the source electrodes Tr11s to Tr1s and the drain electrodes Tr11d to Tr13d are formed at both sides o the block layer BL formed on the semiconductor layer SMC, via the impurity layer OHM for ohmic connection with the semiconductor layer SMC. At this time, the electrode Ecb of the capacitor Cs at its other end, which is connected to the source electrode Tr13s and drain electrode Tr12d, and the supply voltage line La (see FIG. 6) connected to the drain electrodes Tr11d and Tr13d are formed simultaneously by patterning the same source/drain metal layer.

The source electrodes Tr11s to Tr13s and drain electrodes Tr11d to Tr13d of the transistors Tr11 to Tr13 described above, the electrode Ecb at the other end of the capacitor Cs, the selection line Ls, and the supply voltage line La may be may have a stacked wiring structure including an aluminum alloy layer and a transition metal layer, with a view to reducing wiring resistance and reducing migration. The transistors Tr11 to Tr13 is not limited to inversely staggered ones but may be coplanar ones.

Figure 7A:
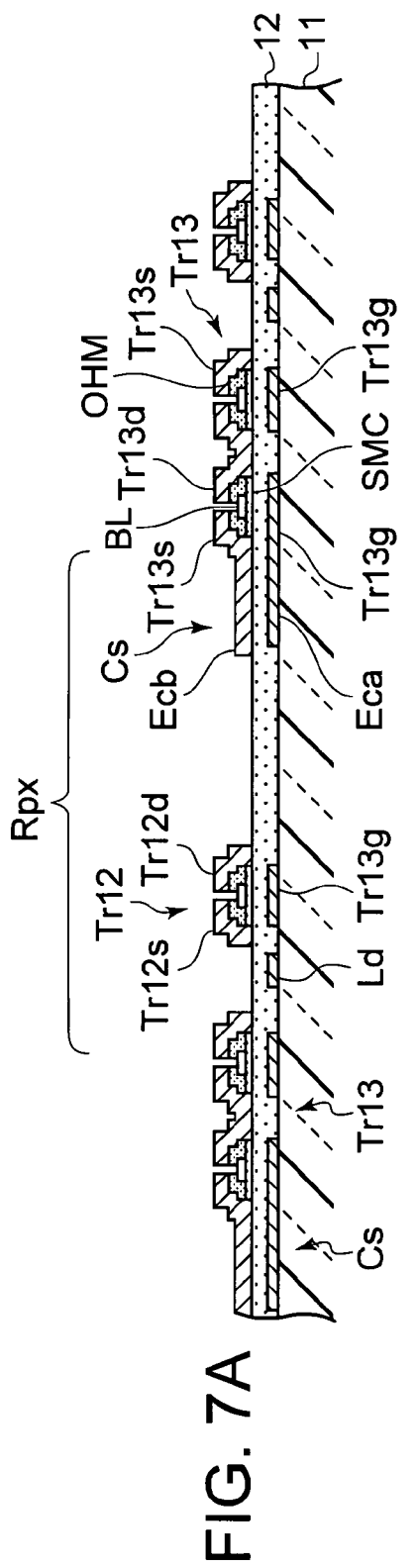
FIGS. 7A to 7C are cross-sectional diagrams of manufacturing steps (part 1) showing an example of a manufacturing method of the display device (display panel) according to the present embodiment.
Figure 7B:
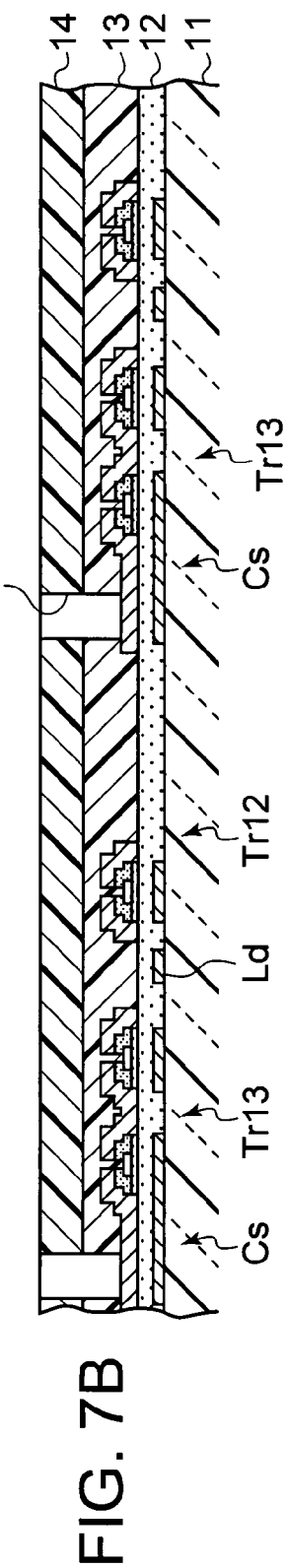

Then, as shown in FIG. 7B, the protective insulating film (passivation film) 13 made of silicon nitride (SiN) or the like and having a thickness of 50 mn to 100 nm and the flattening film 14 made of a photosensitive organic resin material or the like and having a thickness of 1 μm to 10 μm are sequentially formed so as to entirely cover one surface of the insulating substrate 11 including the transistors Tr11 to Tr13, the capacitor Cs, the selection line Ls, and the supply voltage line La. After this, the flattening film 14 and the protective insulating film 13 are patterned by light irradiation and with an etchant to form the contact hole HLd, through which the upper surface of the source electrode Tr13s of the transistor Tr13 (or the upper surface of the electrode Ecb at the other end of the capacitor Cs) is exposed.

Figure 7C:
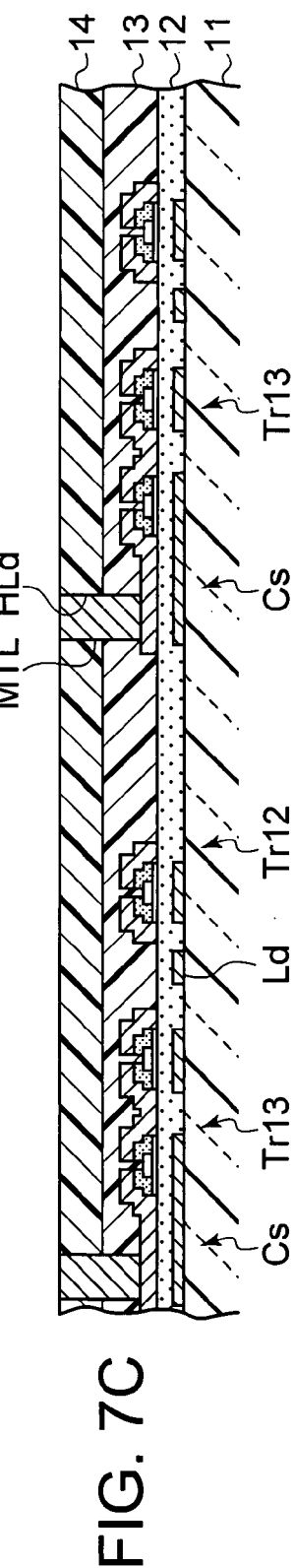

Next, the contact metal MTL made of a metal material is filled in the contact hole HLd as shown in FIG. 7C. Here, a thick film formed by depositing a metal material such as copper (Cu) or the like by, for example, nonelectrolytic plating or the like may be used as the contact metal MTL. After this, the pixel electrode 15 electrically connected to the contact metal MTL is formed in each pixel forming region Rpx (the region where each of the color pixels PXr, PXg, and PXb is formed) as shown in FIG. 8A.

Specifically, the pixel electrode 15 comprises the reflective metal layer 15a on the lower level, which is electrically connected to the contact metal MTL, and the conductive metal oxide layer 15b on the upper level, as shown in FIG. 8A. The reflective metal layer 15a is formed by forming, by sputtering or the like, a reflective metal film having light reflectivity and made of at least any of aluminum (Al), chromium (Cr), silver (Ag), and silver palladium (AgPd) or alloy, and patterning the reflective metal film into a predetermined shape. The conductive metal oxide layer 15b is formed by forming a metal oxide film (having light transmissivity) made of a transparent electrode material such as indium-tin-oxide (ITO), indium-zinc-oxide, or the like so as to entirely cover one surface of the insulating substrate 11 including the reflective metal layer 15a, and patterning the metal oxide film so as not to expose the upper surface and side surfaces of the reflective metal layer 15a.

As described above, by patterning the upper-level metal oxide film so as not to expose the lower-level reflective metal layer 15a, it is possible not to cause a cell reaction between the metal oxide film and the reflective metal layer 15a by an etchant, and to prevent the lower-level reflective metal layer 15a from being excessively etched or damaged by etching.

Next, an insulating layer made of an inorganic insulating material such as silicon oxide film, silicon nitride film, etc. is formed by chemical vapor deposition (CVD) or the like, so as to entirely cover one surface of the insulating substrate 11 including the pixel electrode 15 comprising the reflective metal layer 15a and the conductive metal oxide layer 15b. By patterning this insulating layer, the base layer 18x to be the lowest layer of the bank 18 to be described later is formed in the column direction, in the region (the boundary region between adjoining display pixels PIX) between the pixel electrodes 15 formed in display pixels PIX adjoining each other in the row direction, as shown in FIG. 8B. The base layer 18x is formed to have approximately the same shape as the supply voltage line Lc as shown in FIG. 1, and to open the pixel forming regions of the display pixels PIX as a plurality of stripe-shaped openings.

Then, as shown in FIG. 9A, the bank metal layer 18a (supply voltage line Lc) made of a non-oxidized metal material having low resistance such as copper (Cu), silver (Ag), and aluminum (Al), or pure metal or alloy whose main substance is any of these, is formed on the base layer 18x, so as to open the pixel forming regions of the display pixels PIX as a plurality of stripe-shaped openings. The bank metal layer 18a may internally contain any other material than the non-oxidized metal material, as long as the surface of the bank metal layer 18a is made of the non-oxidized metal material.

Specifically, the bank metal layer 18a is formed by forming a thin film made of the above-described metal material by sputtering, vacuum deposition, or the like, such that the thin film entirely covers one surface of the insulating substrate 11 including the base layer 18x and then applying photolithography to make the thin film remain on the base layer 18x to have a predetermined pattern. The portion of the bank metal layer 18a that extends in the column direction has a row-direction width narrower than that of the base layer 18x, such that the base layer 18x is exposed at both sides of the bank metal layer 18a in the row direction. The base layer 18x is interposed between the flattening film 14 and the bank metal layer 18a so as to improve the adhesiveness between them, and it is preferred that the thermal expansion coefficient of the base layer 18x should be between the thermal expansion coefficient of the flattening film 14 and the thermal expansion coefficient of the bank metal layer 18a.

As a result, the pixel forming regions Rpx (the regions where the organic EL layers 16 of the organic EL elements OEL are formed) of a plurality of display pixels PIX of the same color arrayed in the column direction of the display panel 10 are defined as surrounded by the bank 18 comprising the bank metal layer 18a and the base layer 18x, with the upper surface of the pixel electrodes 15 (conductive metal oxide layer 15b) exposed in the pixel forming regions Rpx.

Next, after the insulating substrate 11 is cleaned with pure water, UV ozone treatment, oxygen plasma treatment or the like is applied to impart lyophilicity to the surface of the pixel electrode 15 exposed in each pixel forming region Rpx defined by the bank 18, (and optionally to the surface of the base layer 18x exposed at the edges of the pixel electrode 15). Here, in this lyophilicity treatment, the surface of the bank metal layer 18a is partially oxidized. If an oxide film is present on the surface of the bank metal layer 18a, a liquid repellency treatment to be described later cannot be applied to the surface of the bank metal layer 18a. Therefore, the oxide film on the surface of the bank metal layer 18a is removed. Then, the liquid repellency treatment is applied selectively to the surface of the bank metal layer 18a, from which the oxide film has been removed.

"Liquid-repellent" used in the present embodiment is defined as describing a condition that a contact angle is 50 degrees or larger, when an organic compound containing liquid which contains a positive hole transporting material to be a later-described positive hole transporting layer, an organic compound containing liquid which contains an electron-transporting light emitting material to be an electron-transporting light emitting material, or an organic solvent used in these solutions is dropped onto an insulating substrate or the like, and the contact angle of the liquid or solvent is measured. "Lyophilic" in contrast with "liquid-repellent" is defined in the present embodiment as describing a condition that the contact angle is 40 degrees or smaller.

In the UV ozone treatment as one example of the lyophilicity treatment on the pixel electrode 15, the insulating substrate 11 is irradiated with ultraviolet rays in an oxygen gas atmosphere to generate active oxygen radicals, and lyophilicity (hydrophilicity) is imparted to the surface of the pixel electrode 15 (the conductive metal oxide layer made of ITO or the like) to give the surface of the pixel electrode 15 improved wettability to an organic compound containing liquid which contains a positive hole transporting material to be the later-described positive hole transporting layer, or an organic compound containing liquid which contains an electron-transporting light emitting material to be the later-described electron-transporting light emitting layer, or the organic solvent used in these solutions.

Further, in the oxide film removing process, the insulating substrate 11 having the above-described bank 18 formed on its one surface is dipped in an acid-based aqueous solution such as ammonium persulfate or the like to be soft-etched and have the oxide film on its surface removed, and then cleaned with pure water and dried.

Next, in the liquid repellency treatment to be applied to the bank metal layer 18a, specifically, the insulating substrate 11 is inserted and dipped in a treatment tank of a liquid repellency treatment solution containing triazine-thiol or a triazine-thiol compound such as fluorine-based triazine-thiol derivative containing fluorine in its functional group, etc. In this treatment, the temperature of the liquid repellency treatment solution is set to about 20 to 30° C., and the dipping time is set to about a few ten seconds to 10 minutes. After this, the insulating substrate 11 is taken out from the liquid repellency treatment solution, and rinsed with alcohol or the like so that the liquid repellency treatment solution (triazine-thiol compound) remaining on the surface of the insulating substrate 11 is washed away. Then, the insulating substrate 11 is additionally cleaned with pure water, and then dried by a blow of nitrogen gas ($N_2$).

At this time, the triazine-thiol compound selectively bonds with the metal on the surface of the bank metal layer 18a to form a coating film thereon, but does not coat the metal oxide (conductive metal oxide layer 15b) on the surface of the pixel electrode 15 or the inorganic insulating film which forms the base layer 18x to such a degree as to show liquid repellency.

Figure 11A:
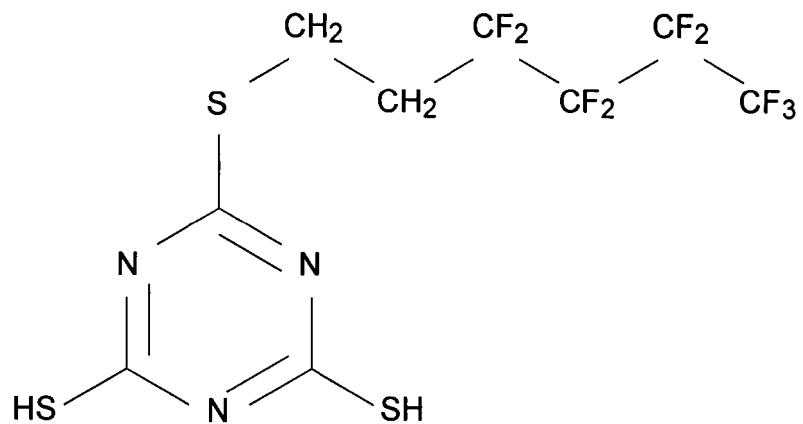
FIGS. 11A and 11B show a chemical constitution formula of a coating material on the surface of a bank formed on the display device (display panel) according to the present embodiment, and a conceptual diagram showing the bond of the coating material when it is coated over a bank metal layer.
Figure 11B:
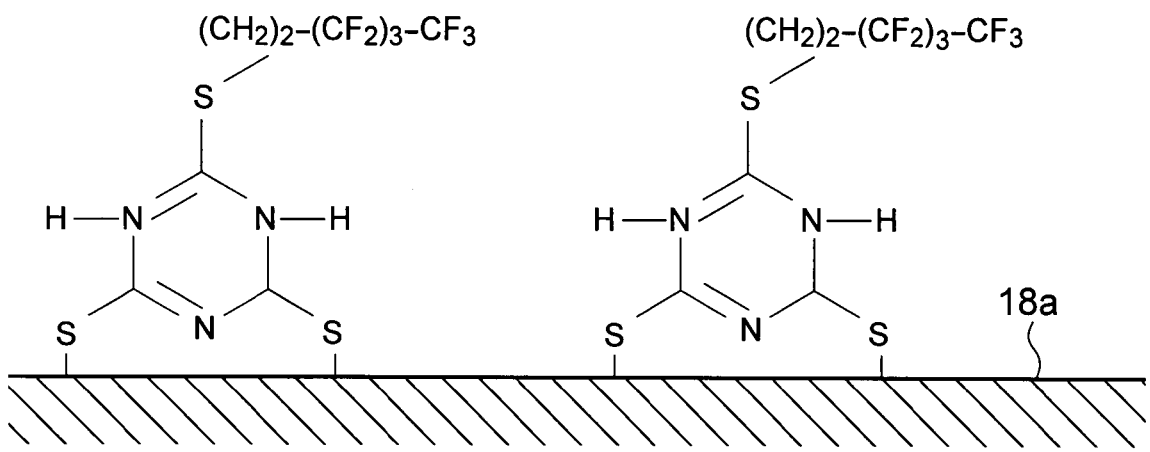

That is, a fluorine-based triazinedithiol derivative, which can be used as one example of a triazine-thiol compound, has such a molecular structure as shown in FIG. 11A, in which triazine (having a six-membered ring structure containing three nitrogen atoms) has thiol groups (—SH) bonding with its nitrogen atoms (—N), with alkyl groups (—$CH_2$—$CH_2$—) and fluorinated alkyl groups (—$CF_2$—$CF_2$—$CF_2$—$CF_3$) sequentially boding with the S atom of one specific thiol group (—SH). As shown in FIG. 11B, the fluorine-based triazinedithiol derivative as well as other triazine-thiol compounds contains fluorine atoms which show liquid repellency, in addition to triazinetrithiol which itself shows liquid repellency. Accordingly, the coating film formed on the surface of the bank metal layer 18a shows stronger liquid repellency than would be shown by triazinetrithiol. It is preferred that the liquid repellency treatment solution used in the above-described treatment have a concentration in the range of about $1\times10^{-4}$ to $1\times10^{-2}$ mol/L.

The fluorine-based triazinedithiol derivative described above has a molecular structure in which the S atom of a thiol group bonds with alkyl groups (—$CH_2$—$CH_2$—), but the S atom of the thiol group may directly bond with fluorinated alkyl groups. Further, there is no specific limitation on the number of carbon atoms in an alkyl group or a fluorinated alkyl group, as long as no distinctive steric barrier occurs. The fluorine-based triazineditihol derivative described above may have the S atom of one of the remaining two thiol groups substituted for directly or indirectly by a fluorinated alkyl group, or may have the carbon atoms of groups containing fluorine atoms form an olefin double bond with each other. Further, as another triazine-thiol derivative, for example, 6-dimethylamino-1,3,5-triazine-2,4-dithiol-sodium salt, or 6-didodecylamino-1,3,5-triazine-2, 4-dithiol-sodium salt may be used, and dissolved in water to form a coating film.

As a result, among the various elements formed on one surface of the insulating substrate 11, the surface of the bank metal layer 18a, which is made of a metal material and from which the oxide film formed in the lyophilicity treatment has been removed in the oxide film removing process, has been improved in bondability with the triazine-thiol compound, and coating of the triazine-thiol compound proceeds thereon to such a degree as to sufficiently show liquid repellency, while the triazine-thiol compound less easily adheres to the surface of the pixel electrode 15 covered with the metal oxide layer (ITO or the like) 15b, the surface of the base layer 18x, or the flattening film 14 (or the protective insulating film 13) exposed between the pixel electrodes 15 to form little coating thereon. Accordingly, there appears on the single insulating substrate 11, a state that the surface of the bank metal layer 18a is only made liquid-repellent and the surface of the pixel electrode 15 exposed in each pixel forming region Rpx defined by the bank 18 is not made liquid-repellent (i.e., kept lyophilic).

Further, the pixel forming regions Rpx of the display pixels PIX (organic EL elements OEL) arrayed in the column direction of the display panel 10 and having the same color is separated from the pixel forming regions Rpx of adjoining display pixels PIX (organic EL elements OEL) having a different color by the bank 18 to which liquid repellency has been imparted. Therefore, even if forming a light emitting layer (electron-transporting light emitting layer 16b), which is to be the later-described organic EL layer 16, is by coating a solution or a dispersion liquid (liquid material) of a light emitting material, light emitting materials do not overleap the bank 18 to mix between adjoining display pixels PIX (color pixels PXr, PXg, and PXb), preventing color mixture between adjoining color pixels.

Next, a solution of a positive hole transporting material or a liquid in which the positive hole transporting material is dispersed is coated over the pixel forming regions (the regions where the organic EL elements OEL are formed) Rpx of the respective colors surrounded (defined) by the bank 18 at a same step, with the use of an ink jetting method for jetting a plurality of liquid drops independent from one another onto a predetermined position, a nozzle printing method for pouring a continuous flow of solution, or the like, and then any residual solvent is removed by heating and drying, thereby the positive hole transporting layer 16a is formed as show in FIG. 9B. Subsequently, a solution of an electron-transporting light emitting material or a liquid in which the electron-transporting light emitting material is dispersed is coated on the positive hole transporting layer 16a, and then any residual solvent is removed by heating and drying, thereby the electron-transporting light emitting layer 16b is formed, as shown in FIG. 10A. As a result, the organic EL layer (light emitting function layer) 16 including the positive hole transporting layer 16a and the electron-transporting light emitting layer 16b is formed stacked.

Specifically, for example, polyethylenedioxithiophene/polystyrenesulfonate aqueous solution (PEDOT/PSS; a dispersion liquid obtained by dispersing polyethylenedioxithiophene PEDOT, which is a conductive polymer, and polystyrenesulfonate PSS as a dopant in a water solvent) is coated on the pixel electrode 15 (conductive metal oxide layer 15b) as an organic compound containing liquid which contains an organic high-molecular positive hole transporting material (carrier transporting material). Thereafter, a stage on which the insulating substrate 11 is mounted or the atmosphere above the stage is heated and dried under a temperature condition of 100° C. or higher to remove any residual solvent, thereby to fix the organic high-molecular positive hole transporting material on the pixel electrode 15 and form the positive hole transporting layer 16a as a carrier transporting layer.

Here, since the pixel electrode 15 and the surface of the base layer 18x at the edges of the pixel electrode 15 have lyophilicity to the above-described organic compound containing liquid (PEDOT/PSS), the organic compound containing material coated in the pixel forming region Rpx defined by the bank 18 fits well to this region (on the pixel electrode 15) and spreads over the region uniformly.

Since this enables the organic compound containing liquid to be dried in the heating and drying process while the organic compound containing liquid is drawn toward the edges, the positive hole transporting layer 16a does not rise up too high at the center of the pixel electrode 15 and the uniformity of the film thickness is improved. Further, since the surface of the bank metal layer 18a has liquid repellency to the above-described organic compound containing liquid (PEDOT/PSS), the organic compound containing material is prevented from leaking or overleaping to adjoining pixel forming regions.

Then, for example, a solution obtained by dissolving a light emitting material which contains a conjugated double bond polymer such as polyparaphenylenevinylene, polyfluorene, etc. in water or an organic solvent such as tetraphosphor, tetramethylbenzene, mesitylene, xylene, etc. is coated on the positive hole transporting layer 16a as an organic compound containing liquid which contains an organic high-molecular electron-transporting light emitting material (carrier transporting material). Thereafter, a drying process is carried out by heating a stage under a nitrogen atmosphere or by heating the atmosphere above the stage under a depressurized atmosphere equal to or under 1 Torr to remove the solvent, thereby to fix the organic high-molecular electron-transporting light emitting material on the positive hole transporting layer 16a and form the electron-transporting light emitting layer 16b, which is a carrier transporting layer and also a light emitting layer.

In this case too, since the surfaces of the positive hole transporting layer 16a on the pixel electrode 15 and base layer 18x at the edges of the pixel electrode 15 have lyophilicity to the above-described organic compound containing liquid likewise the above-described positive hole transporting layer 16a, the organic compound containing liquid coated in the pixel forming region Rpx defined by the bank 18 fits well to this region (on the positive hole transporting layer 16a) and spreads over this region uniformly.

Since this enables the organic compound containing liquid to be dried in a later-described heating drying process while the organic compound containing liquid is drawn to the edges, the uniformity of the film thickness of the electron-transporting light emitting layer 16a formed on the positive hole transporting layer 16a is improved. Further, since the surface of the bank metal layer 18a has liquid repellency to the organic compound containing liquid, the organic compound containing liquid can be prevented from leaking or overleaping to adjoining pixel forming regions.

After this, a conductive layer (transparent electrode layer) having light transmissivity is formed on the insulating substrate 11 including at least the pixel forming regions Rpx, thereby the opposing electrode (e.g., a cathode electrode) 17, which faces the respective pixel electrodes 15 in common through the organic EL layer 16 (the positive hole transporting layer 16a and the electron-transporting light emitting layer 16b), is formed, as shown in FIG. 10B. The opposing electrode 17 may be formed to have a film structure in which a thin film which is made of a metal material such as calcium (Ca), barium (Ba), magnesium, fluorinated lithium, etc. and which is to serve as an electron injecting layer is formed by, for example, vacuum deposition, sputtering, or the like, and thereupon a transparent electrode layer made of ITO or the like is stacked, so that the film structure is transparent in the thickness-wise direction.

The opposing electrode 17 is formed as a single conductive layer that spreads not only over the region facing the pixel electrode 15 but over the bank 18 defining the pixel forming regions Rpx (the regions in which the organic EL elements OEL are formed), and is joined to the bank meta layer 18a constituting the bank 18 to have electrical connection with the bank metal layer 18a. Consequently, the bank metal layer 18a constituting the bank 18 can be used a common voltage line (cathode line) Lc connected in common to the respective display pixels PIX. By placing the bank metal layer 18a having the same potential as the opposing electrode 17 between all the display pixels PIX (organic EL elements OEL), it is possible to reduce the sheet resistance of the cathode on the whole and to make the whole display panel 10 uniform in display characteristics.

Next, after the opposing electrode 17 is formed, the sealing layer 19 including silicon oxide film, silicon nitride film, or the like is formed all over one surface of the insulating substrate 11 by using CVD or the like, as a protective insulating film (passivation film). Further, a sealing cover or the sealing substrate 20 is joined (adhered) to the sealing layer 19 with the use of a UV-set or thermoset adhesive, thus completing the display panel 10 having the cross sectional structures shown in FIG. 5 and FIG. 6.

In the above-described embodiment, a case has been explained, in which the organic EL layer 16 comprises the positive hole transporting layer 16a and the electron-transporting light emitting layer 16b. The present invention is not limited to this, but the organic EL layer 16 may comprise only a dual-functional positive-hole-transporting/electron-transporting light emitting layer, or comprise a positive-hole-transporting light emitting layer and an electron transporting layer, or arbitrarily comprise a carrier transporting layer in-between, or comprise a combination of any other carrier transporting layers.

In the above-described embodiment, the pixel electrode 15 is an anode. This is not the only case, but the pixel electrode 15 may be a cathode. In this case, the carrier transporting layer of the organic EL layer 16, that contacts the pixel electrode 15, needs to be an electron transporting layer.

(Comparative Verification)

Next, the workings and effects unique to the manufacturing method of the display device according to the present invention as described above will be verified in detail.

Figures 12A, 12B:
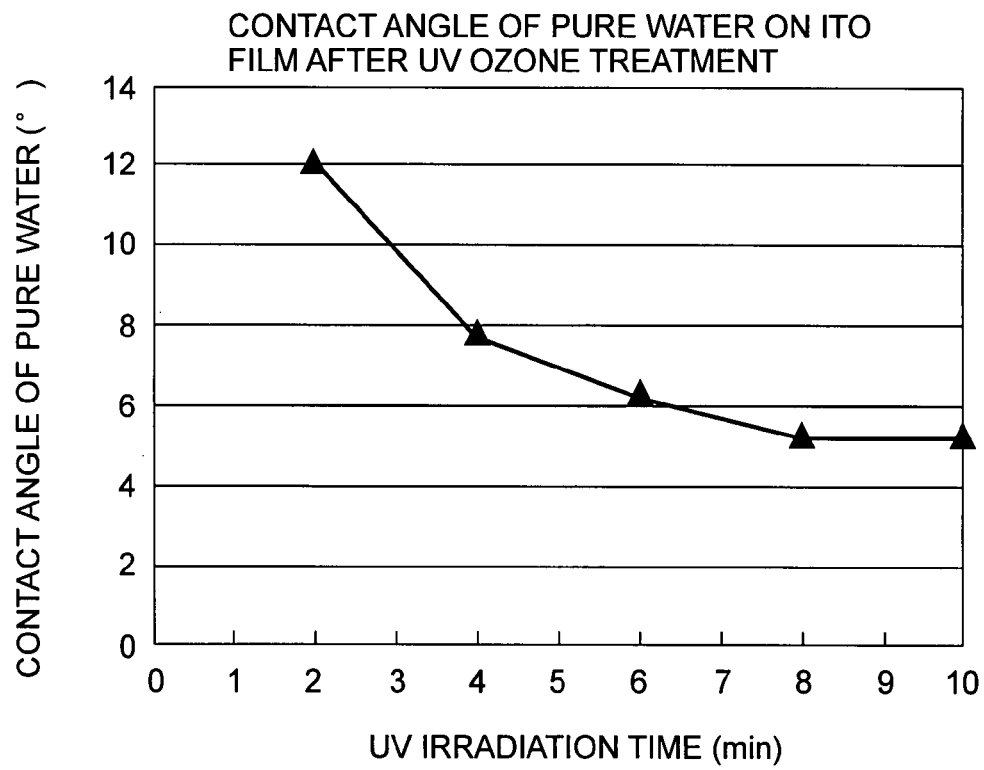
FIGS. 12A and 12B show experimental data indicating relationship between time duration for ultraviolet irradiation in UV ozone treatment and a contact angle of pure water.
Figures 13A, 13B:
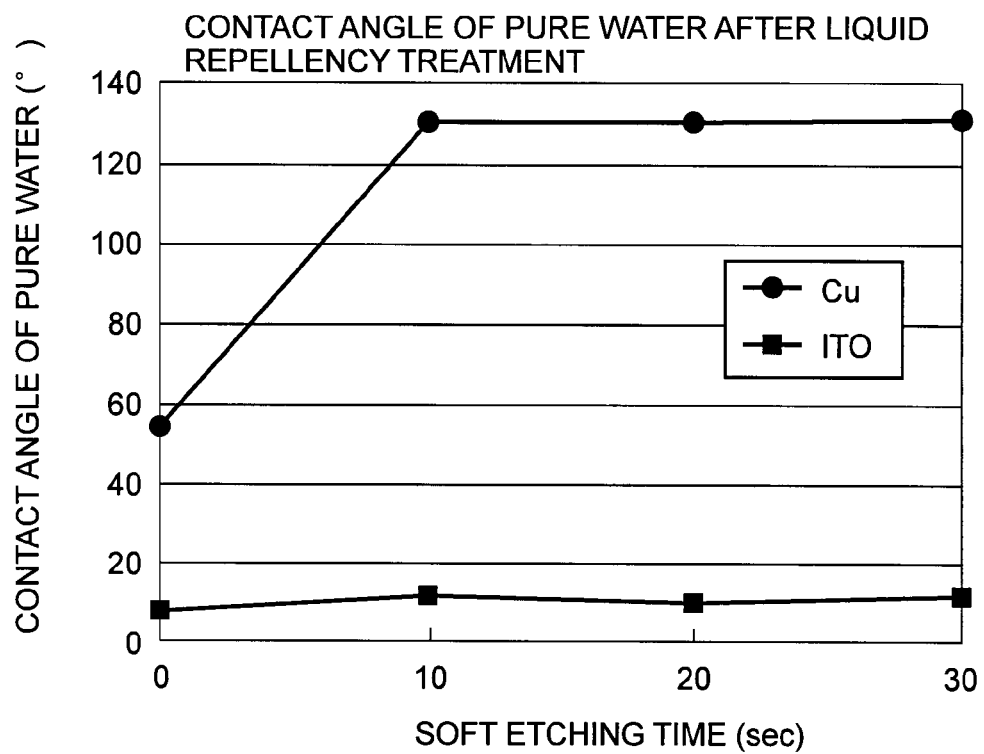
FIGS. 13A and 13B show experimental data indicating relationship between time duration for soft etching after lyophilicity treatment and a contact angle of pure water after liquid repellency treatment.

FIG. 12 show experimental data indicating the relationship between the time duration for ultraviolet irradiation in the UV ozone treatment and the contact angle of pure water. FIG. 13 show experimental data indicating the relationship between the time duration for soft etching carried out after the lyophilicity treatment and the contact angle of pure water after the liquid repellency treatment. FIG. 12A and FIG. 13A are tables of values acquired in the experiments and FIG. 12B and FIG. 13B are graphs plotting the values indicated in FIG. 12A and FIG. 13A.

In the above-described embodiment, the insulating substrate 11, on one surface of which the pixel forming regions Rpx of the display pixels PIX (organic EL elements OEL) are defined by the bank 18 protruding from that surface, is subjected to the lyophilicity treatment by UV ozone treatment or the like, and then dipped in an acid-based aqueous solution such as ammonium persulfate so that the surface of the bank 18 is soft-etched. After this, the insulating substrate 11 is dipped in a liquid repellency treatment solution such as triazine-thiol compound or the like to form a coating film of triazine-thiol compound on the surface of the bank 18 to impart liquid repellency thereto. Thereby, a hydrophilic and hydrophobic pattern, in which a region (the surface of the pixel electrode) that shows lyophilicity and a region (the surface of the bank) that shows liquid repellency are coexistent, is formed on the insulating substrate 11. A manufacturing method having this flow has been shown in the above-described embodiment.

Here, other than the manufacturing method according to the above-described embodiment, such a method is conceivable as the method for forming a hydrophilic and hydrophobic on the insulating substrate, in which the insulating substrate is dipped in a liquid repellency treatment solution to impart liquid repellency to the surface of the bank, and after this, the surface of the pixel electrode (conductive metal oxide layer) that is exposed in each pixel forming region is subjected to lyophilicization by UV ozone treatment, oxygen plasma treatment, or the like (hereinafter referred to as "first comparative example" for convenience purposes).

In this manufacturing method, the coating film having liquid repellency (the coating film of triazine-thiol compound), which is formed on the surface of the bank subjected to liquid repellency treatment at the former step, is dissolved by the UV ozone treatment or the oxygen plasma treatment in the lyophilicity treatment, and thereby the liquid repellency on the surface of the bank is deteriorated. Therefore, in coating the organic compound containing liquid, there occurs a problem of mixture of light emitting colors (color mixture) between display pixels, with light emitting materials of different colors mixing into adjoining pixel forming regions (organic EL elements).

As a method for avoiding this kind of problem, such a method is conceivable, in which after the pixel electrode in each pixel forming region is subjected to lyophilicization by UV ozone treatment, oxygen plasma treatment or the like, the insulating substrate is dipped in the liquid repellency treatment solution with no soft etching on the surface of the bank, thereby to form a liquid-repellent coating film on the surface of the bank and impart liquid repellency to the surface of the bank (hereinafter referred to as "second comparative example" for convenience purposes).

In this case, if copper, silver, or alloy which has low resistance and whose main substances are copper and silver is used as the metal material to constitute the bank (or the surface of the bank), since the oxide film formed on the surface of these metals by the UV ozone treatment, the oxygen plasma treatment, or the like is not removed, there occur problems that a liquid-repellent coating film (a coating film of triazine-thiol compound) is harder to form at the succeeding step of liquid repellency treatment, and that the adhesiveness between the opposing electrode (for example, a cathode electrode) to be formed on the organic EL layer and the bank is reduced to increase the contact resistance. Particularly, in a case where copper, which has low resistance and is relatively cheap, is used as the metal material to constitute the bank, the bank is more greatly oxidized than in a case where silver is used. This makes it extremely difficult for the triazine-thiol compound to bond with the bank in the liquid repellency treatment, resulting in insufficient formation of a liquid-repellent coating film and a great drop of liquid repellency.

Assume that in the first and second comparative examples, copper was used as the metal material to constitute the bank and UV ozone treatment was employed as the lyophilicity treatment, and the contact angle of pure water was measured under this condition. In the first comparative example in which UV ozone treatment was applied after copper was dipped in a liquid repellency treatment solution of triazine-thiol compound to form a coating film and impart liquid repellency, the contact angle of pure water measured 73.2 degrees. In the second comparative example in which after UV ozone treatment was applied to copper, the surface of the bank was dipped in a liquid repellency treatment solution without previously being soft-etched to acquire liquid repellency, the contact angle of pure water measured 54.5 degrees. In both of these cases, it was revealed that the contact angle of pure water was relatively small and the degree of liquid repellency was low.

Meanwhile, as has been described in the above-described embodiment, in a case where an organic compound containing liquid such as PEDOT/PSS or the like is used as the material of the organic EL layer (positive hole transporting layer) to be formed on the pixel electrode, this solution easily coagulates during the process of coating and drying this solution, and the film thickness of the positive hole transporting layer to be formed tends to be uneven. In order to make the film thickness of the positive hole transporting layer made of PEDOT/PSS uniform, it is necessary to carry out lyophilicization treatment on the pixel electrode (conductive metal oxide layer) such that the contact angle of pure water on the surface of the pixel electrode becomes about 10 degrees.

The contact angle of pure water at each step of the manufacturing method shown in the above-described embodiment will now be checked from such a point of view. First, in the process of applying UV ozone treatment to the insulating substrate to impart lyophilicity to the surface of the pixel electrode (conductive metal oxide layer), it was revealed that as the time duration for ultraviolet irradiation (UV irradiation time) became longer, the contact angle of pure water on the surface of the pixel electrode decreased, down to 10 degrees or smaller as shown in FIG. 12, thus increasing lyophilicity to the above-described PEDOT/PSS.

Here, specifically, the contact angle of pure water was measured on a pixel electrode on which formed was an ITO film (conductive metal oxide layer) which was subjected to UV ozone treatment with the use of an UV ozone cleaner (model number: NL-UV253) by Filgen, Inc. under oxygen injection conditions of flow rate being 10 L/min and injection time being 0.3 min.

As a result, it was revealed that it was possible to obtain a contact angle of pure water of 10 degrees or smaller with ultraviolet irradiation of about 4 minutes (min.), and more preferably, it was possible to securely obtain a contact angle of pure water of 10 degrees or smaller obtained with ultraviolet irradiation of bout 10 minutes (min.), in the lyophilicity treatment on the insulating substrate (on the pixel electrode comprising a conductive metal oxide film made of ITO film).

Then, after the UV ozone treatment, the insulating substrate was dipped in an ammonium persulfate aqueous solution having a concentration of 1.0 wt % and set to a room temperature to be soft-etched, thereby the oxide film formed in the UV ozone treatment on the surface of copper constituting the bank was removed. After this, liquid repellency treatment was carried out by dipping the insulating substrate in the liquid repellency treatment solution containing triazine-thiol compound and forming a liquid-repellent coating film on the surface of copper constituting the bank. In this case, as shown in FIG. 13, it was revealed that as the soft etching time (time during which the insulating substrate was dipped in the ammonium persulfate aqueous solution) became longer, the contact angle of pure water on the surface of the bank (copper) increased, and was set to about 130 degree, at which sufficient liquid repellency to PEDOT/PSS was shown, as compared to the contact angle of pure water (73.2 degrees, 54.5 degrees) observed in the case where liquid repellency treatment was carried out with no soft etching.

As a result, it was revealed that it was possible to securely obtain a contact angle of pure water of about 130 degrees, by dipping the insulating substrate in the ammonium persulfate aqueous solution for about 10 seconds or longer, as the soft etching process carried out before the liquid repellency treatment on the bank (copper) formed on the insulating substrate.

Further, it was revealed that the contact angle of pure water on the surface of the pixel electrode (ITO film) after this liquid repellency treatment was carried out was generally constant (about 9 to 11 degrees) regardless of the length of the soft etching time, as shown in FIG. 13, meaning that lyophilicity to PEDOT/PSS was sufficiently maintained.

As described above, according to the manufacturing method of the present embodiment, lyophilicity treatment on the pixel forming region (pixel electrode) is applied by UV ozone treatment or the like to the insulating substrate (panel substrate) on which regions for forming display pixels (organic EL elements) are defined by the bank made of a metal material, the surface of the bank is then soft-etched, and finally a coating film of triazine-thiol compound is formed to impart liquid repellency. This manufacturing method enables fine lyophilicity to be realized on the surface of the pixel electrode (ITO film) exposed in the pixel forming region with the contact angle of pure water thereon being about 10 degrees or smaller, and enables fine liquid repellency to be realized on the surface of the bank defining the pixel forming region with the contact angle of pure water on that surface being about 130 degrees or larger. Accordingly, at the step of coating an organic compound containing liquid (PEDOT/PSS or the like) on the insulating substrate for forming the organic EL layer, it is possible to form the organic EL layer (light emitting function layer) to have a uniform film thickness because the organic compound containing liquid can fit well to the entire surface of the pixel electrode and spread all over this surface. At the same time, it is possible to prevent a phenomenon that light emitting colors are mixed between adjoining display pixels with light emitting materials having different colors mixing into adjoining pixel forming regions (organic EL elements).

Further, since the oxide film formed on the surface of the bank by UV ozone treatment or the like in the lyophilicity treatment is removed by soft etching before the water repellency treatment, the adhesiveness between the bank and the opposing electrode, which is formed in common for the respective pixel forming regions (pixel electrodes) after the organic EL layer is formed, is improved, realizing a fine electrical connection.

Accordingly, it is possible to obtain a desired display quality by suppressing the light emission start voltage in the light emitting operation and the wavelength (chromaticity) of light to be emitted from the organic EL layer from straying from the intended values, and to realize a display panel excellent in reliability and longevity by suppressing occurrence of deterioration and connection failure of the organic EL element.

In the above-described comparative verification, explanation has been given to a case that UV ozone treatment is employed as the lyophilicity treatment on the pixel electrode. The present invention is not limited to this. Likewise by UV ozone treatment, also in the case where the lyophilicity treatment is applied by oxygen plasma treatment which generates oxygen radicals in plasma and imparts lyophilicity (hydrophilicity) to the surface of the pixel electrode (conductive metal oxide layer made of ITO or the like), approximately the same data as the above-described experimental data can be obtained, which means that similar effects can be obtained.

According to the display device and manufacturing method thereof according to the present invention, it is possible to realize a display panel on which a carrier transporting layer, including an organic EL layer having an improved uniformity of film thickness generally all over the region for forming each display pixel with no color mixture between adjoining display pixels, is formed.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2006-152964 filed on Jun. 1, 2006 and Japanese Patent Application No. 2006-131002 filed on May 10, 2006 and including specification, claims, drawings and summary. The disclosures of the above Japanese Patent Applications are incorporated herein by reference in their entireties.

What is claimed is:

1. A method of manufacturing a display device, the method comprising:
   forming a partitioning wall which is arranged along a pixel forming region where a display pixel provided with a pixel electrode is formed;
   imparting lyophilicity to a surface of the pixel electrode and a surface of a side of the partitioning wall;
   etching the surface of the side of the partitioning wall after the imparting lyophilicity; and
   imparting liquid repellency to the surface of the side of the partitioning wall after the etching.

2. The method according to claim 1, wherein when imparting lyophilicity to the surface of the pixel electrode, lyophilicity with respect to a solution containing a carrier transporting material for forming a carrier transporting layer is imparted to at least the surface of the pixel electrode by UV ozone treatment or oxygen plasma treatment.

3. The method according to claim 1, wherein when etching the surface of the side of the partitioning wall, an oxide, which is formed on at least the surface of the side of the partitioning wall when imparting lyophilicity to the surface of the pixel electrode, is removed.

4. The method according to claim 1, wherein when imparting liquid repellency to the surface of the side of the partitioning wall, a substrate on which the partitioning wall is formed is dipped in a solution of a triazine-thiol compound, and by the triazine-thiol compound bonding with at least the surface of the side of the partitioning wall, a coating film having liquid repellency with respect to a solution containing a carrier transporting material is formed on at least the surface of the side of the partitioning wall.

5. The method according to claim 1, wherein the surface of the pixel electrode is formed of a conductive metal oxide layer.

6. The method according to claim 1, wherein at least the surface of the side of the partitioning wall is made of a metal material having low resistance.

7. The method according to claim 1, wherein the region where the display pixel is formed is defined by the partitioning wall.

8. The method according to claim 1, further comprising:
forming a carrier transporting layer on the pixel electrode exposed in the pixel forming region.

9. The method according to claim 1, further comprising:
coating a solution containing a carrier transporting material on the pixel electrode to which lyophilicity has been imparted, drying the solution, and forming a carrier transporting layer; and
forming an opposing electrode which faces the pixel electrode through the carrier transporting layer, and which is connected to the partitioning wall.

10. A method of manufacturing a display device, the method comprising:
imparting lyophilicity to a surface of a pixel electrode and a surface of a side of a partitioning wall which are formed in a region which surrounds the pixel electrode;
etching the surface of the side of the partitioning wall after the imparting lyophilicity; and
imparting liquid repellency to the surface of the side of the partitioning wall after the etching.

* * * * *